United States Patent
Suzuki et al.

(10) Patent No.: US 9,714,866 B1
(45) Date of Patent: Jul. 25, 2017

(54) SUBSTRATE HAVING A HOLE, METHOD FOR MANUFACTURING THE SUBSTRATE, INFRARED SENSOR, AND METHOD FOR MANUFACTURING THE INFRARED SENSOR

(71) Applicant: ROHM CO., LTD., Kyoto (JP)

(72) Inventors: Tatsuya Suzuki, Kyoto (JP); Yoshikazu Fujimori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/352,196

(22) Filed: Nov. 15, 2016

(30) Foreign Application Priority Data

Jan. 6, 2016 (JP) .................. 2016-001219

(51) Int. Cl.
*G01J 5/02* (2006.01)
*C23C 14/18* (2006.01)
*C23C 14/08* (2006.01)
*C23C 14/34* (2006.01)

(52) U.S. Cl.
CPC .......... *G01J 5/0235* (2013.01); *C23C 14/081* (2013.01); *C23C 14/083* (2013.01); *C23C 14/185* (2013.01); *C23C 14/34* (2013.01); *G01J 5/024* (2013.01)

(58) Field of Classification Search
CPC ....... G01J 5/0235; G01J 5/024; C23C 14/185; C23C 14/081; C23C 14/083; C23C 14/35
See application file for complete search history.

(56) References Cited

U.S. PATENT DOCUMENTS

2011/0210414 A1  9/2011  Nakatani

FOREIGN PATENT DOCUMENTS

| JP | H06-281503 A | 10/1994 |
|----|---|---|
| JP | 2009-170638 A | 7/2009 |
| JP | 2011-179953 A | 9/2011 |

*Primary Examiner* — David Porta
*Assistant Examiner* — Faye Boosalis
(74) *Attorney, Agent, or Firm* — Rabin & Berdo, P.C.

(57) ABSTRACT

A resist mask 40, having penetrating holes 41, is formed on a rear surface of a silicon substrate 2. A planar shape of each penetrating hole 41 is formed to a shape with which its respective sides are curved to inwardly convex arcuate shapes with respect to a regular quadrilateral that is a target shape of a transverse section at a processing ending end side of a corresponding cavity 3. Next, dry etching is applied to the silicon substrate 2. The cavities 3 are thereby formed in the silicon substrate 2. As the etching progresses, a transverse sectional shape of each cavity 3 decreases in inward projection amounts of the respective arcuate shaped sides in the transverse sectional shape of the corresponding penetrating hole 41 of the resist mask 40. At a processing ending end side of the cavity 3, its planar shape is substantially the same shape as the regular quadrilateral that is the target shape.

9 Claims, 41 Drawing Sheets

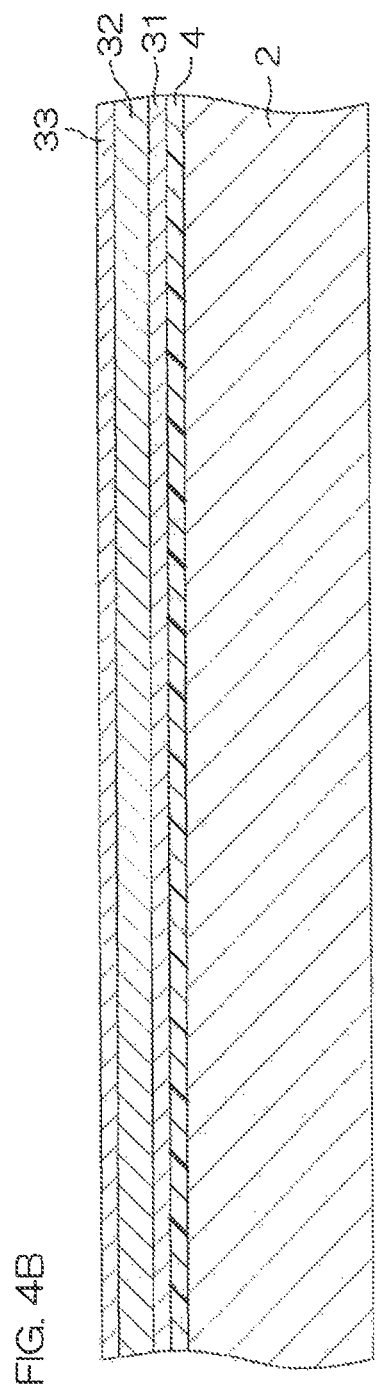

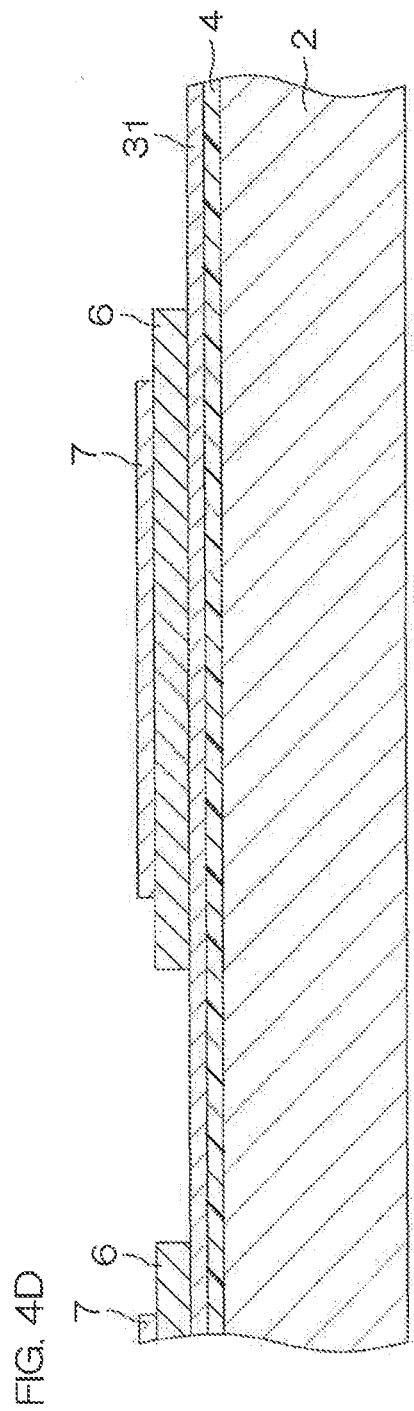

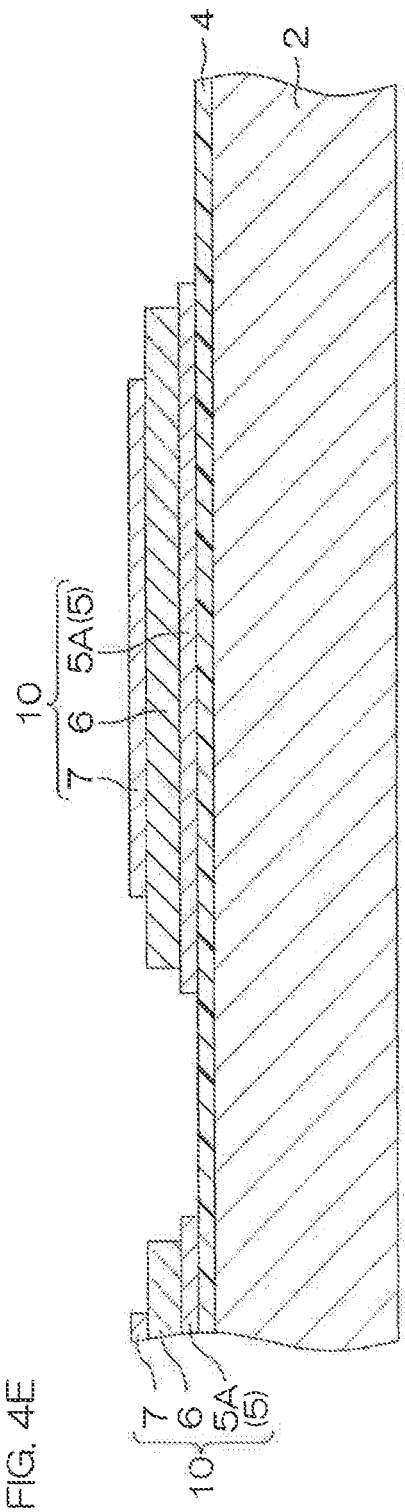

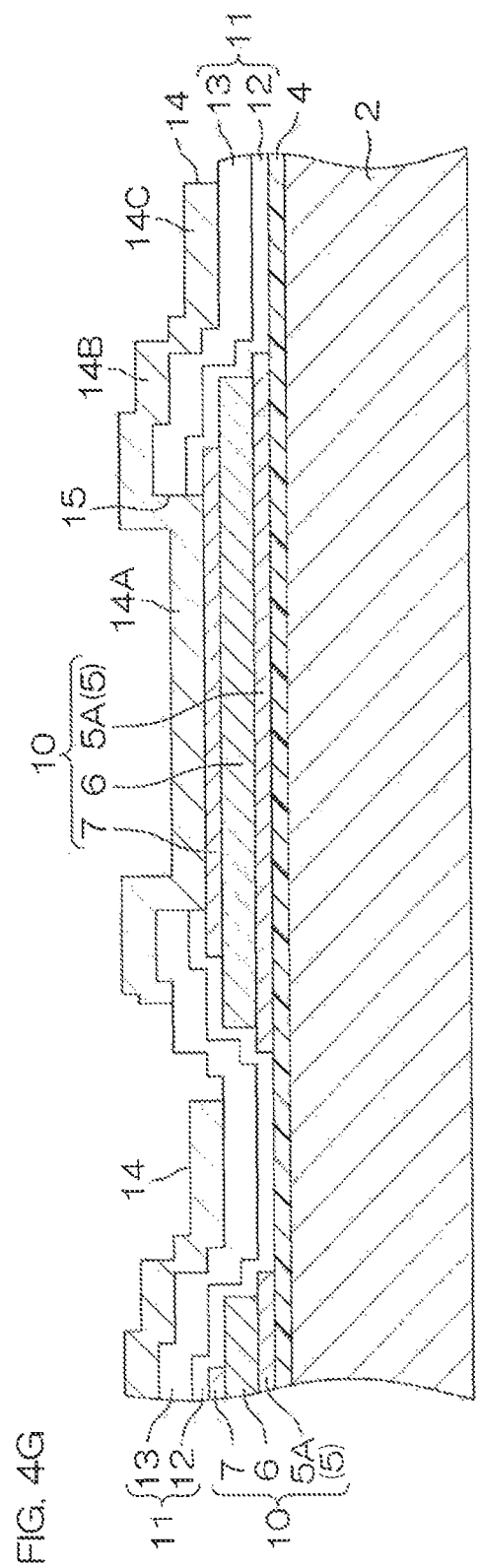

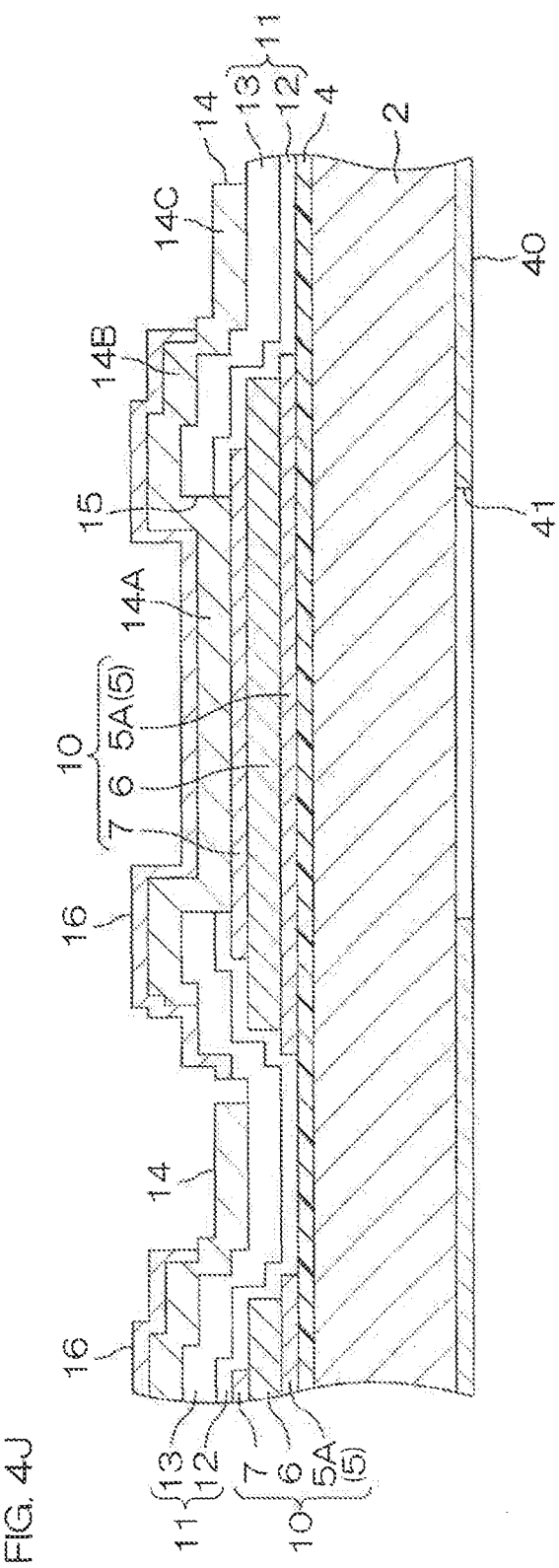

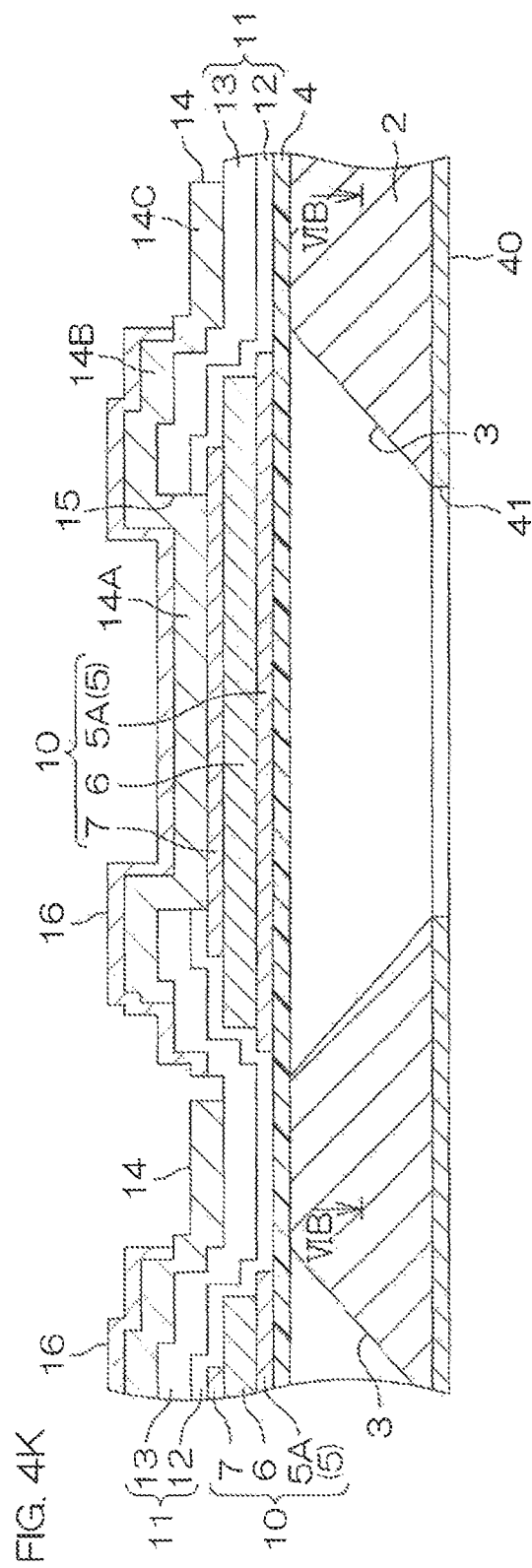

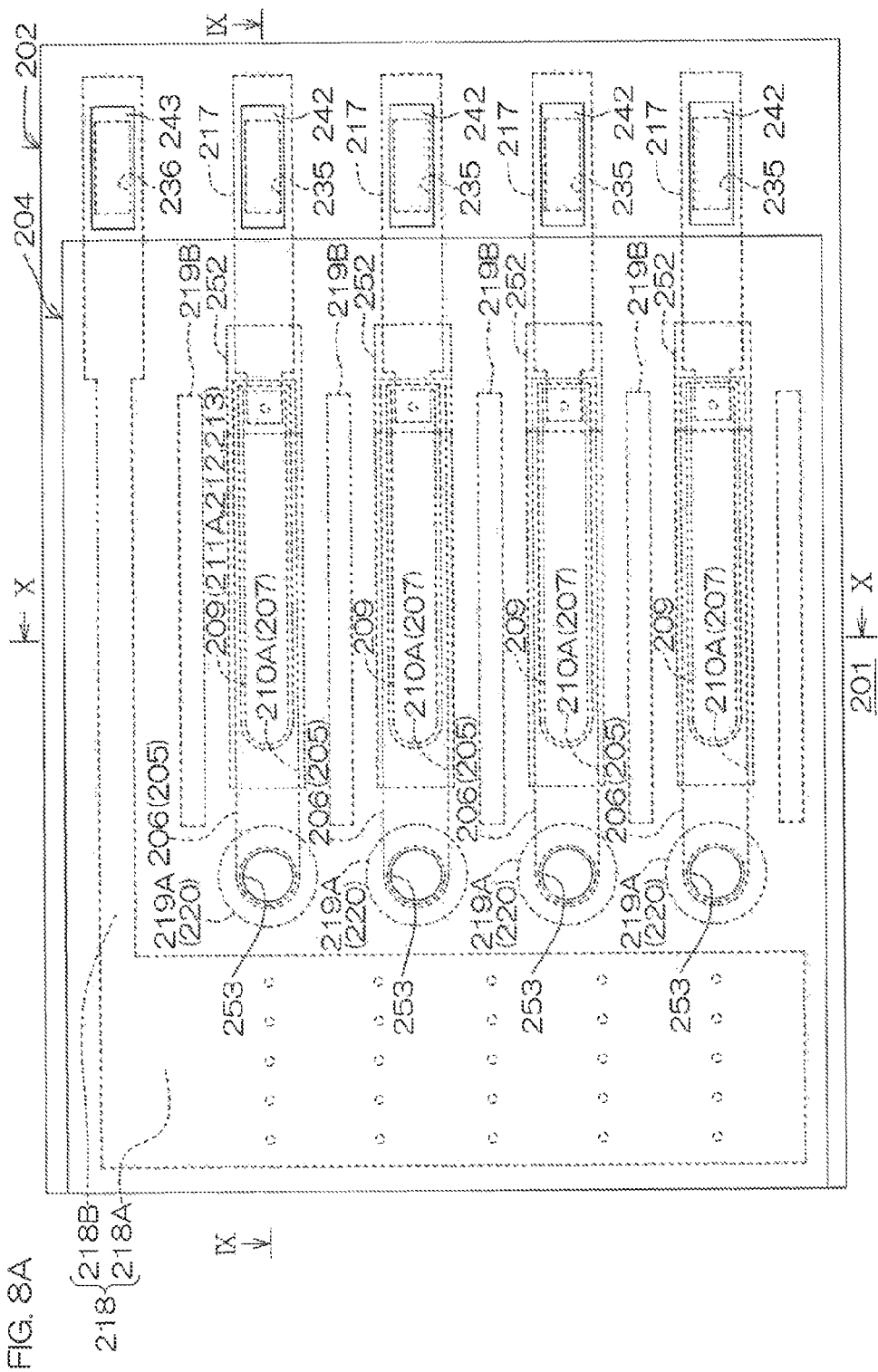

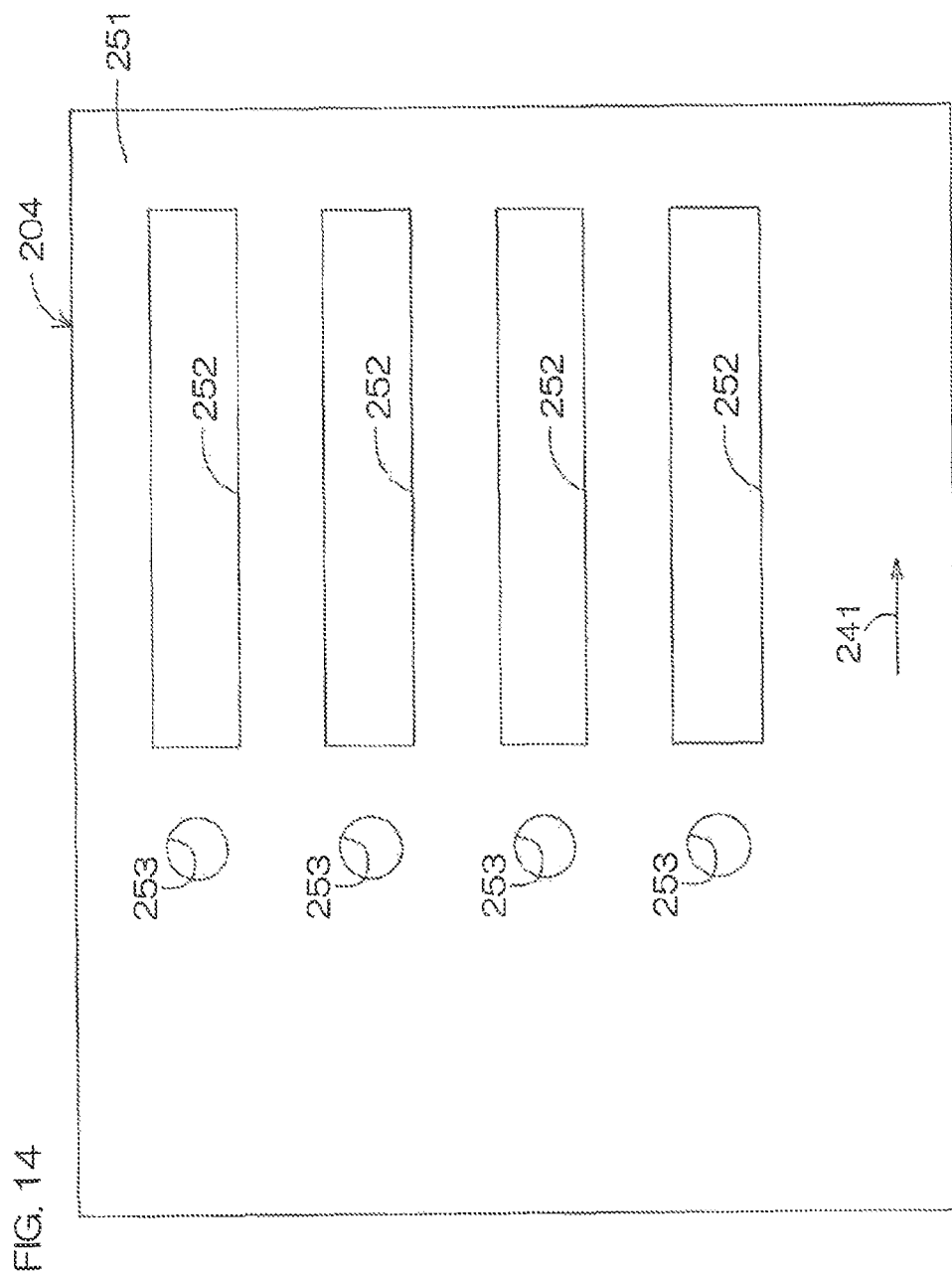

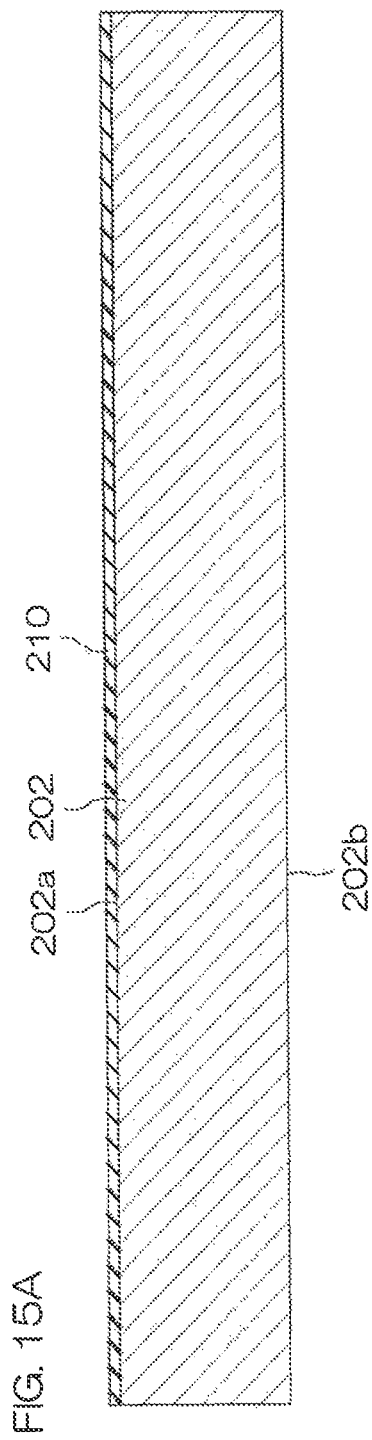

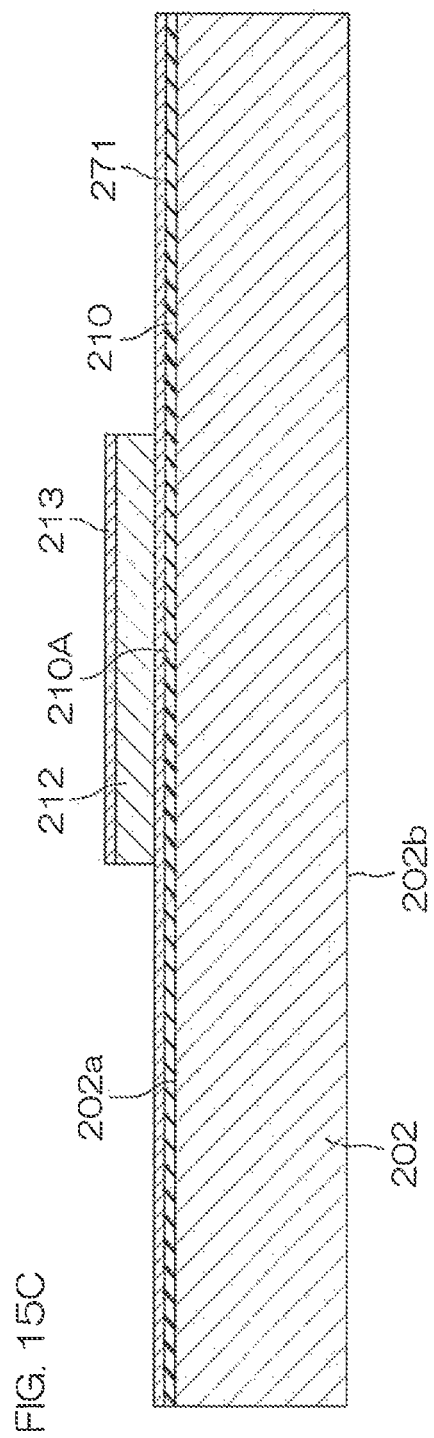

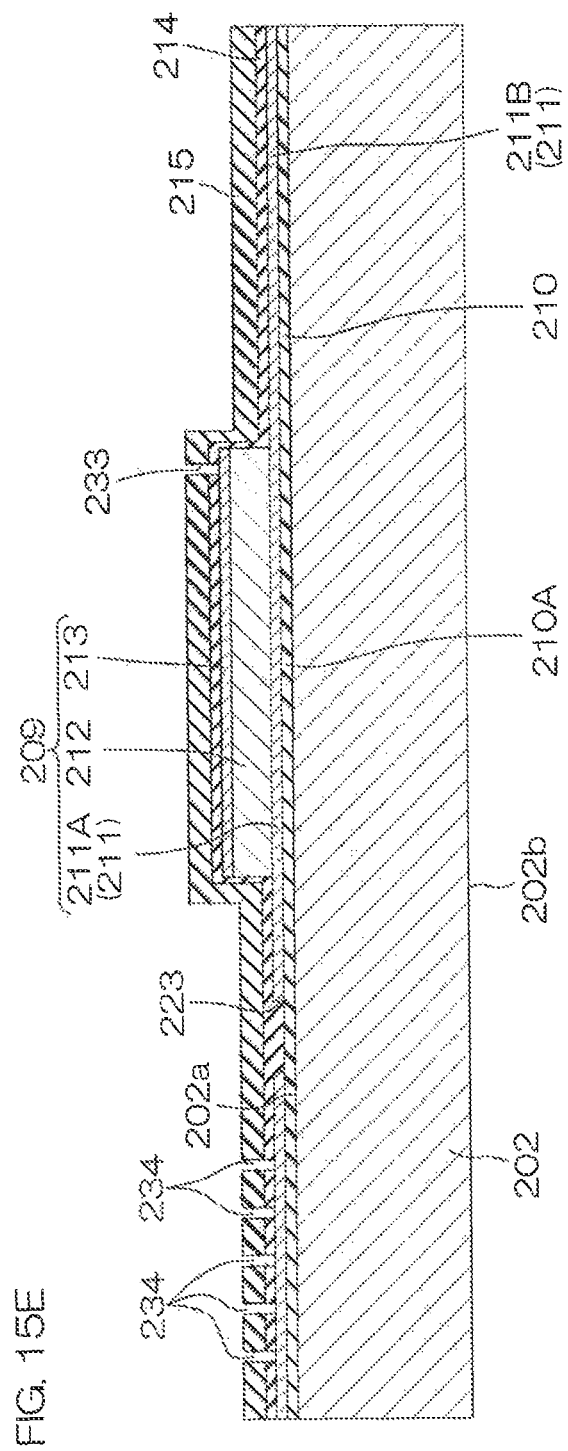

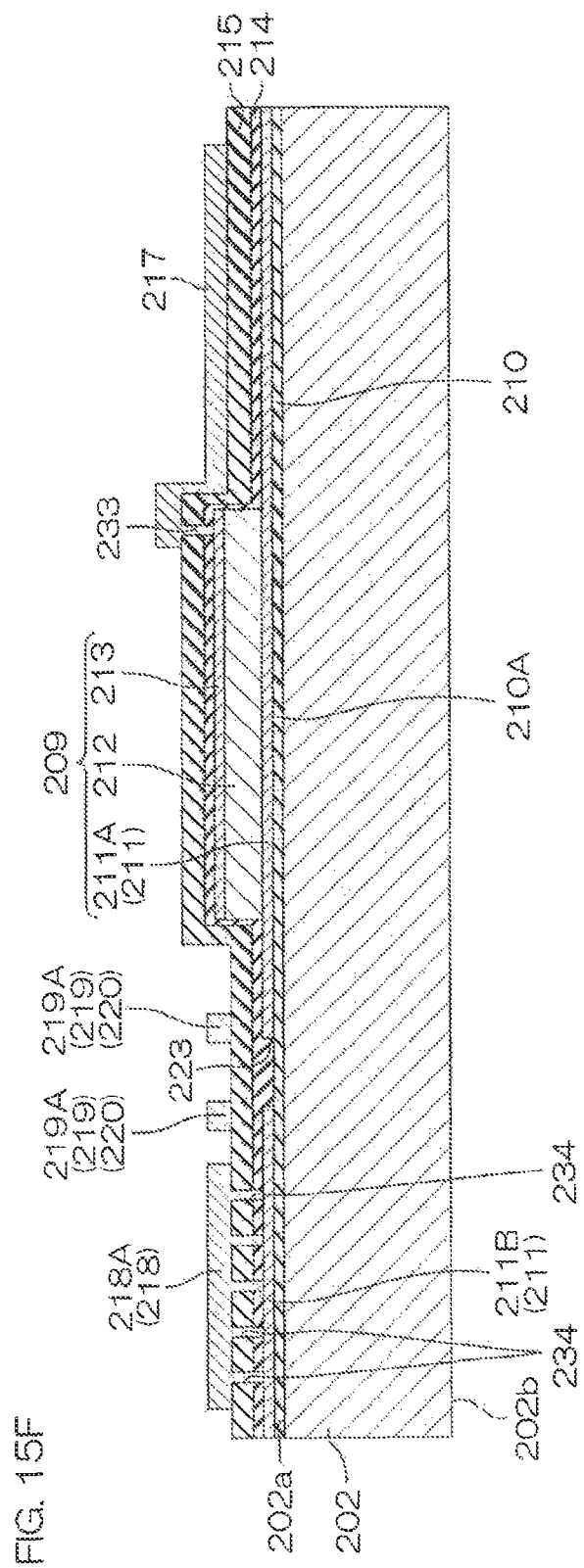

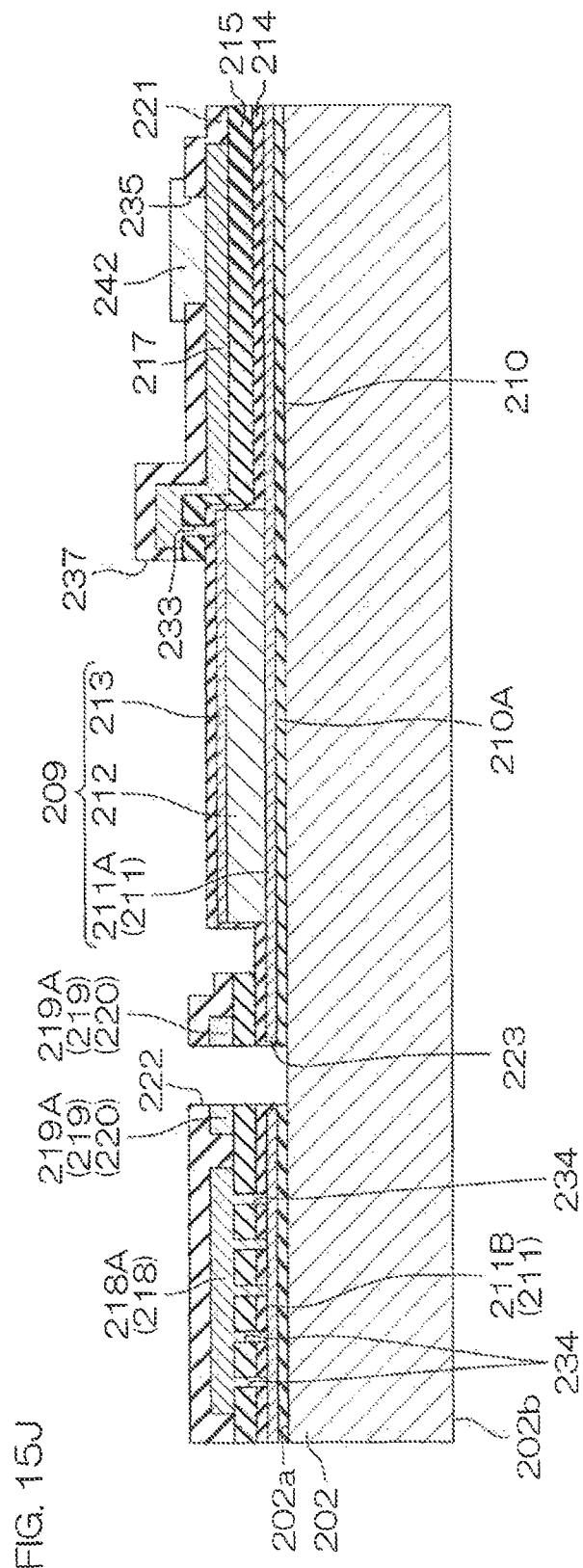

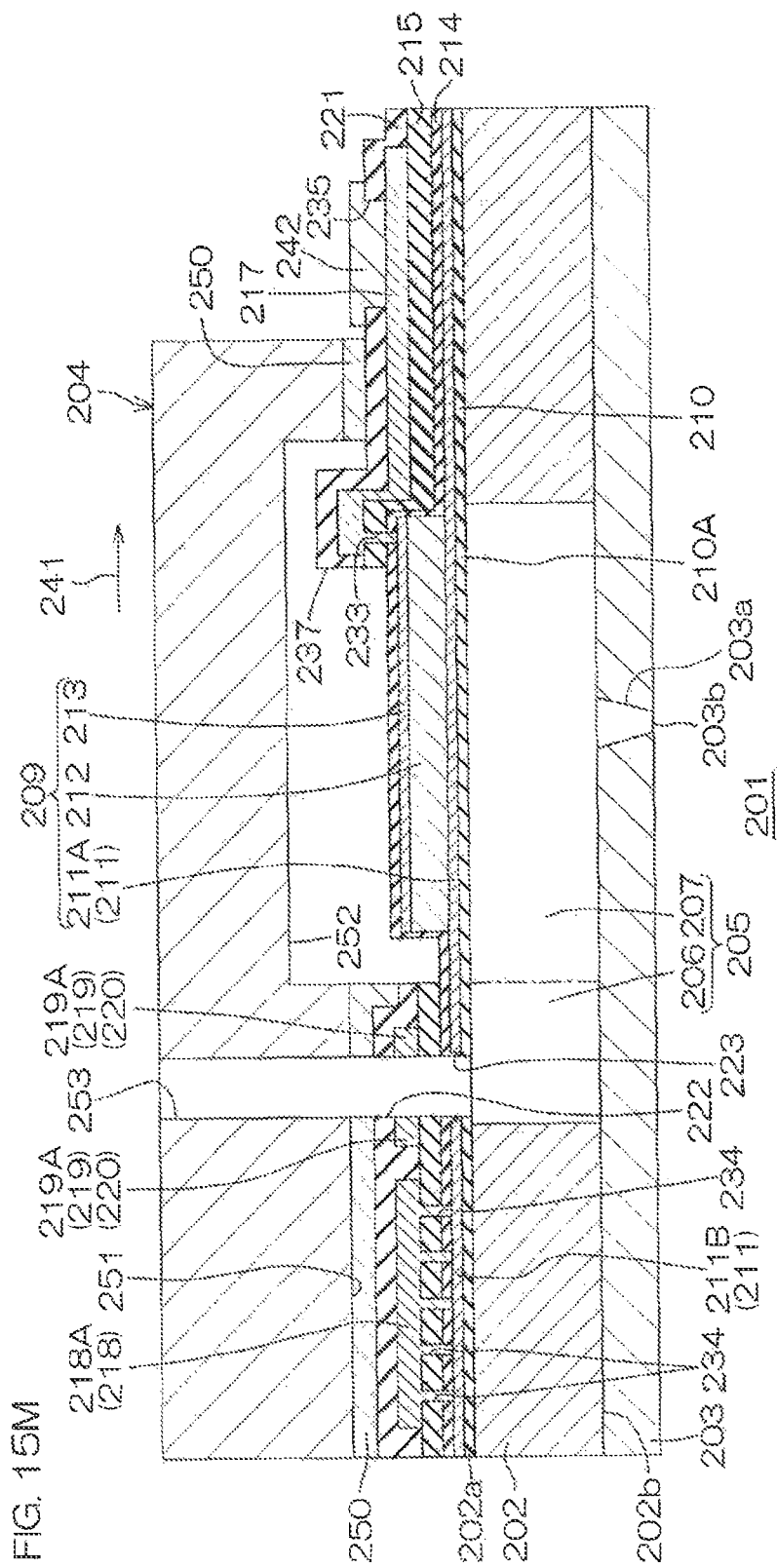

SUBSTRATE HAVING A HOLE, METHOD FOR MANUFACTURING THE SUBSTRATE, INFRARED SENSOR, AND METHOD FOR MANUFACTURING THE INFRARED SENSOR

BACKGROUND OF THE INVENTION

1. Field of the Invention

The present invention relates to a substrate having a hole, a method for manufacturing the substrate, an infrared sensor, and a method for manufacturing the infrared sensor.

2. Description of the Related Art

As a method for forming a hole, with which a transverse sectional shape is a polygonal shape, in a substrate, there is known a method where dry etching using a mask having a penetrating hole with a transverse section that is a polygon is applied to the substrate.

SUMMARY OF THE INVENTION

The inventor of preferred embodiments of the present invention described and claimed in the present application conducted an extensive study and research regarding a substrate having a hole and a method for manufacturing the substrate, such as the one described above, and in doing so, discovered and first recognized new unique challenges and previously unrecognized possibilities for improvements as described in greater detail below.

When a hole is formed in a substrate by dry etching using a mask having a penetrating hole with which a transverse sectional shape is a polygon, a transverse sectional shape at a processing ending end side is blunted in comparison to the transverse sectional shape of the penetrating hole of the mask. There is thus a problem that the transverse sectional shape at the processing ending end side cannot be formed to a predetermined polygon.

A conventional method for forming a hole, with which a transverse sectional shape is, for example, a regular quadrilateral shape (square), in a substrate shall now be described with reference to FIG. 19A, FIG. 19B, and FIG. 19C. FIG. 19A is a plan view, FIG. 19B is a vertical sectional view, and FIG. 19C is a bottom view.

A mask 110 has a penetrating hole 111 with which a transverse sectional shape is a regular tetragon. Dry etching is applied to a substrate 100 in a state where the mask 110 is disposed at a surface side of the substrate 100 (upper surface side of the substrate 100 in the present example). A hole 101 is thereby formed in the substrate 100. As shown in FIG. 19C, a bottom surface shape (transverse sectional shape) at a processing ending end side of the hole 101 is a shape that is not a regular tetragon but is close to being a circle.

An object of the present invention is to provide a substrate having a hole, with which a transverse sectional shape at a processing ending end side is a shape close to being a predetermined polygon, and a method for manufacturing the substrate.

An object of the present invention is to provide an infrared sensor that includes a substrate having a hole, with which a transverse sectional shape at a processing ending end side is a shape close to being a predetermined polygon, and a method for manufacturing the infrared sensor.

In order to overcome the previously unrecognized and unsolved challenges described above, a preferred embodiment of the present invention provides a substrate having a hole. With the substrate having the hole, a transverse sectional shape of a processing starting end side of the hole is a shape with which respective sides of a predetermined polygon are formed to inwardly convex arcuate shapes and a transverse sectional shape of a processing ending end side of the hole is a shape closer to the predetermined polygon in comparison to the transverse sectional shape of the processing starting end side of the hole. With the present arrangement, a substrate with which a transverse sectional shape of a processing ending end side of a hole is a shape close to a predetermined polygonal shape is obtained.

In the preferred embodiment of the present invention, the predetermined polygon is a quadrilateral.

In the preferred embodiment of the present invention, the predetermined polygon is a triangle.

An infrared sensor according to the present invention includes the substrate having the hole, a heat insulating film held by the substrate so as to face the hole, and a pyroelectric element formed above the heat insulating film.

With the present arrangement, an infrared sensor that includes a substrate with which a transverse sectional shape of a processing ending end side of a hole is a shape close to a predetermined polygon is obtained. Also with the present arrangement, the hole of the substrate can be used as a cavity for thermally separating the pyroelectric element from the substrate.

With the preferred embodiment of the present invention, the pyroelectric element includes a lower electrode formed at a surface of the heat insulating film at an opposite side from the hole, an upper electrode disposed at an opposite side from the heat insulating film with respect to the lower electrode, and a pyroelectric film provided between the lower electrode and the upper electrode.

The present invention is a method for manufacturing a substrate having a hole and includes a step of disposing, on one surface side of the substrate, a mask having a penetrating hole with a shape with respective sides thereof being curved to inwardly convex arcuate shapes with respect to a predetermined polygon and a step of applying dry etching to the substrate via the mask to form a hole in the substrate.

With the present manufacturing method, a substrate having a hole, with which a transverse sectional shape of a processing ending end side is a shape close to a predetermined polygon, can be manufactured.

In the preferred embodiment of the present invention, the predetermined polygon is a quadrilateral.

In the preferred embodiment of the present invention, the predetermined polygon is a triangle.

A method for manufacturing an infrared sensor according to the present invention includes a step of forming a heat insulating film above one surface of the substrate, a step of forming a pyroelectric element above the heat insulating film, a step of forming a covering film covering surfaces of the heat insulating film and the pyroelectric element, a step of forming, above the pyroelectric element, a contact hole, exposing a portion of the upper electrode, in the covering film, a step of forming, above the covering film, a wiring with one end portion contacting the upper electrode via the contact hole and another end portion being led to an outer side of the pyroelectric element, and a step of forming a cavity, penetrating through the substrate in a thickness direction, at a position of the substrate facing the pyroelectric element. The step of forming the cavity includes a step of disposing, on a surface of the substrate at an opposite side from the surface at which the heat insulating film has been formed, a mask having a penetrating hole with a shape with respective sides thereof being curved to inwardly convex arcuate shapes with respect to a predetermined polygon and a step of applying dry etching to the substrate via the mask to form the cavity in the substrate.

With the present manufacturing method, an infrared sensor can be manufactured that includes a substrate having a hole, with which a transverse sectional shape of a processing ending end side is a shape close to a predetermined polygon.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A is an illustrative plan view for describing the arrangement of a main portion of an inkjet printing head to which a substrate having a hole according to a second preferred embodiment of the present invention is applied.

FIG. 14 is a bottom view of a main portion of the protective substrate as viewed from an actuator substrate side of the inkjet printing head.

FIG. 15A is a sectional view of an example of a manufacturing process of the inkjet printing head.

FIG. 15C is a sectional view of a step subsequent to that of FIG. 15B.

FIG. 15E is a sectional view of a step subsequent to that of FIG. 15D.

FIG. 15F is a sectional view of a step subsequent to that of FIG. 15E.

FIG. 15J is a sectional view of a step subsequent to that of FIG. 15I.

FIG. 15M is a sectional view of a step subsequent to that of FIG. 15L.

DETAILED DESCRIPTION OF THE PREFERRED EMBODIMENTS

Preferred embodiments of the present invention shall now be desried in detail with reference to the attached drawings.

Figure 1:
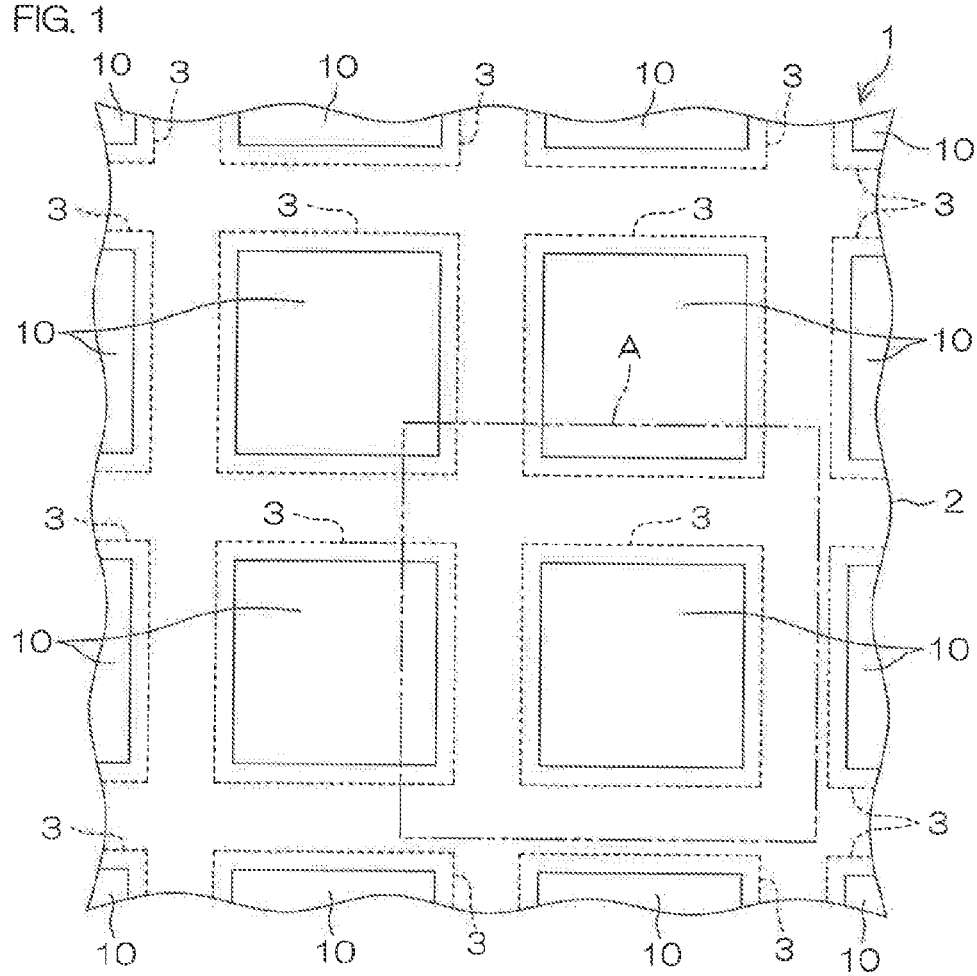
FIG. 1 is a schematic plan view of an infrared sensor to which a substrate having a hole according to a first preferred embodiment of the present invention is applied.
Figure 2:
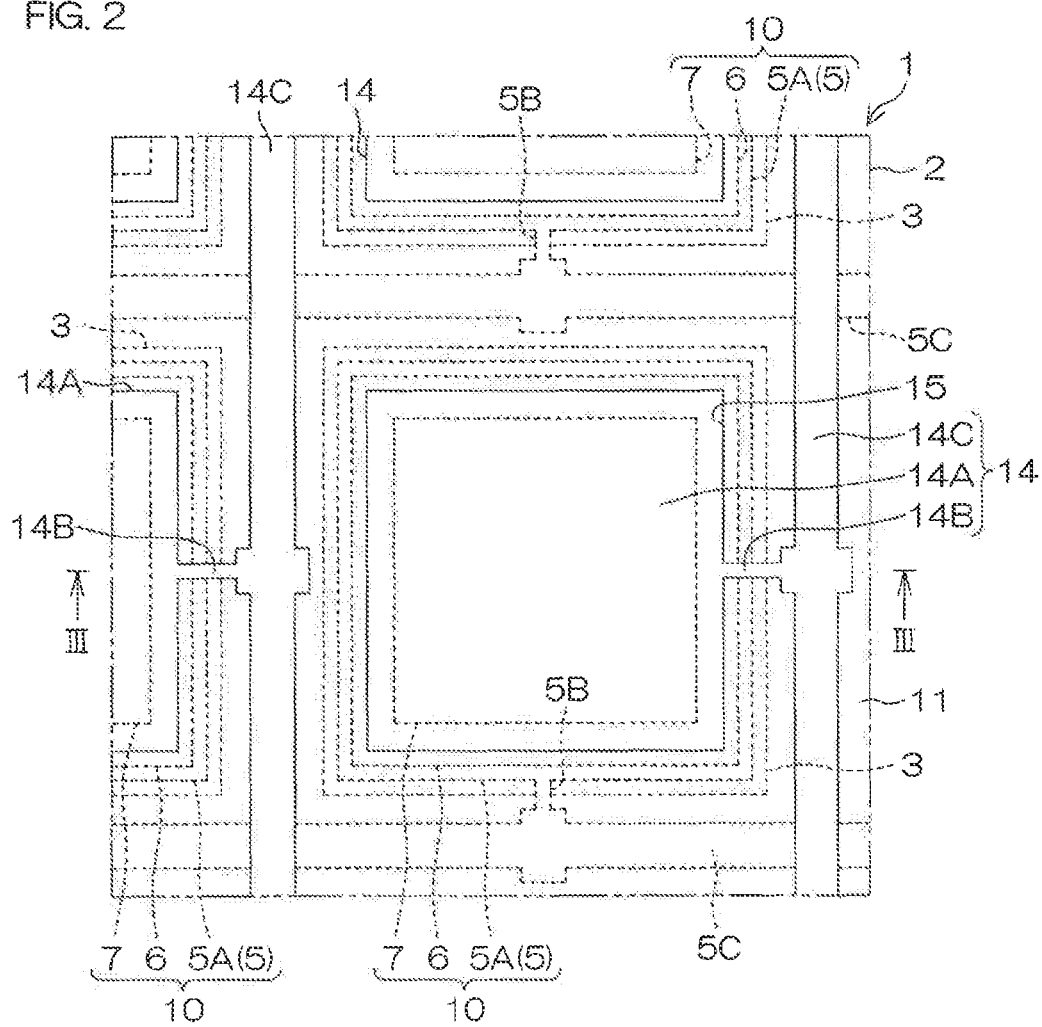
FIG. 2 is a partially enlarged plan view showing an A portion of FIG. 1 in enlarged manner.
Figure 3:
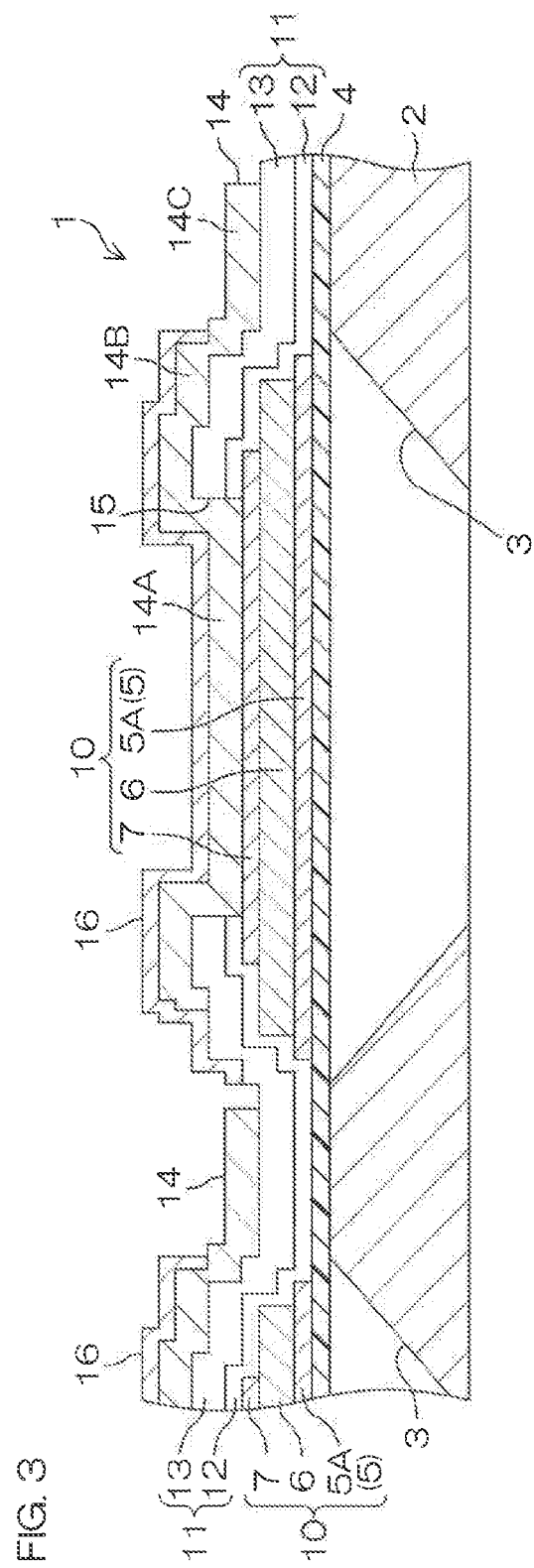
FIG. 3 is a schematic enlarged sectional view taken along line III-III in FIG. 2.

FIG. 1 is a schematic plan view of an infrared sensor to which a substrate having a hole according to a first preferred embodiment of the present invention is applied. FIG. 2 is a schematic enlarged plan view showing a vicinity of an A portion of FIG. 1 in enlarged manner. FIG. 3 is a schematic sectional view taken along line III-III in FIG. 2. In FIG. 2, a filter layer indicated by the symbol 16 in FIG. 3 is omitted.

The infrared sensor 1 includes a silicon substrate 2. A plurality of cavities 3, penetrating through the silicon substrate 2 in a thickness direction, are formed in the silicon substrate 2. The cavities 3 are formed by digging in from a rear surface of the silicon substrate 2. The cavities 3 are formed to thermally separate pyroelectric elements 10, to be described below, from the silicon substrate 2. Each cavity 3 is formed to a regular quadrilateral (square) shape in plan view. The plurality of cavities 3 are disposed in an array in plan view. The cavity 3 is an example of a hole according to the present invention.

A heat insulating film 4 is formed above the silicon substrate 2 to close the cavities 3. The heat insulating film 4 is constituted of silicon oxide ($SiO_2$) in the present preferred embodiment. Above the heat insulating film 4, pyroelectric elements 10 are disposed at positions facing the respective cavities 3. Each pyroelectric element 10 is formed to a regular quadrilateral shape in plan view. The plurality of pyroelectric elements 10 are disposed in an array in plan view.

The pyroelectric elements 10 include lower electrodes 5, formed at a front surface of the heat insulating film 4 at an opposite side from the cavities 3, pyroelectric films 6, formed above the lower electrode 5, and upper electrodes 7, formed above the pyroelectric films 6.

Each lower electrode 5 is constituted of main electrode portions 5A, each of regular quadrilateral shape in plan view that constitutes the corresponding pyroelectric element 10, lead-out portions 5B, each extending outside the corresponding cavity 3 from a center of length of one side of the corresponding main electrode portion 5A, and a wiring portion 5C, connected to corresponding lead-out portions 5B and extending in parallel to the one side of corresponding main electrode portions 5A. The lower electrode 5 has, for example, a two-layer structure with which a layer constituted of titanium (Ti) and a layer constituted of platinum (Pt) are laminated in that order from the heat insulating film 4 side.

Each pyroelectric film 6 is formed to a regular quadrilateral shape slightly smaller than the corresponding main electrode portion 5A of the lower electrode 5 in plan view. The four sides of the pyroelectric film 6 are, in plan view, respectively parallel to the four sides of the main electrode portion 5A of the lower electrode 5 and disposed at inner sides across predetermined intervals with respect to the corresponding sides of the main electrode portion 5A. In the present preferred embodiment, the pyroelectric film 6 is constituted of lead zirconate titanate (PZT:$Pb(Zr,Ti)O_3$) and is formed, for example, by a sol-gel method.

Each upper electrode 7 is formed to a regular quadrilateral shape slightly smaller than the corresponding pyroelectric film 6 in plan view. The four sides of the upper electrode 7 are, in plan view, respectively parallel to the four sides of the pyroelectric film 6 and disposed at inner sides across predetermined intervals with respect to the corresponding sides of the pyroelectric film 6. In the present preferred embodiment, the upper electrode 7 has a two-layer structure with which a layer constituted of iridium (Ir) and a layer constituted of iridium oxide ($IrO_2$) are laminated in that order from the pyroelectric film 6 side.

Also, a covering film 11 is formed above the heat insulating film 4. Portions of an upper surface of the heat insulating film 4 exposed from the lower electrodes 5, portions of upper surfaces of the main electrode portions 5A of the lower electrodes 5 exposed from the pyroelectric films 6, the lead-out portions 5B and the wiring portions 5C of the lower electrodes 5, portions of upper surfaces of the pyroelectric films 6 exposed from the upper electrodes 7, side surfaces of the pyroelectric films 6, and the upper electrodes 7 are covered all together by the covering film 6. The cover film 11 includes a hydrogen barrier film 12, constituted of alumina ($Al_2O_3$), and an insulating film 13, formed above the hydrogen barrier film 12 and constituted of silicon oxide ($SiO_2$).

Wirings 14 are formed in a predetermined pattern above the covering film 11. The wirings 14 are constituted of a metal material that contains aluminum (Al) as a main component. The wirings 14 are provided at positions facing the upper electrodes 7 across the cover film 11. Between the wirings 14 and the upper electrodes 7, penetrating holes (contact holes) 15 are formed to penetrate through in a thickness direction in the cover film 11. One end portions of the wirings 14 enter into the penetrating holes 15 and are connected to the upper electrodes 7 inside the penetrating holes 15. Each wiring 14 is constituted of electrode connection portions 14A, each of regular quadrilateral shape in plan view having a central portion connected to the corresponding upper electrode 7, lead-out portions 14B, each extending outside the corresponding cavity 3 from a center of length of one side of the corresponding electrode connection portion 14A, and a main wiring portion 14C, connected to the lead-out portions 14B and extending in parallel to the one side of the electrode connection portions 14A. In plan view, the main wiring portions 14C of the wiring 14 and the wiring portions 5C of the lower electrode 5 are disposed so as to be orthogonal to each other.

Also, optical filter layers 16, which transmit near infrared rays, are formed on surfaces of the covering film 11 and the wirings 14 at regions facing the cavities 3 in plan view. The optical filter layers 16 are constituted of titanium (Ti) in the present preferred embodiment.

When a temperature of the pyroelectric film 6 inside a pyroelectric element 10 increases due to incidence of infrared rays, a pyroelectric current due to spontaneous polarization of the pyroelectric film 6 is output from the pyroelectric element 10. The infrared rays can thus be detected based on the pyroelectric current.

FIG. 4A to FIG. 4K are sectional views of an example of a manufacturing process of the infrared sensor 1 and show a section corresponding to FIG. 3.

Figure 4A:
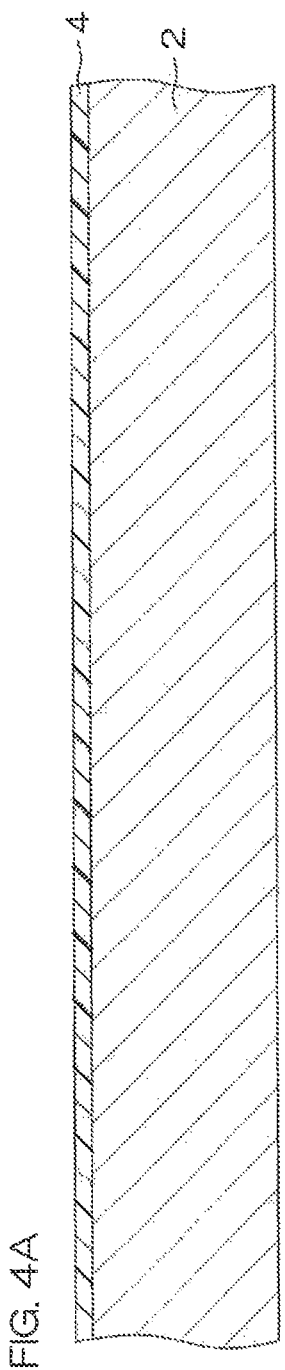
FIG. 4A is a sectional view of an example of a manufacturing process of the infrared sensor.

First, as shown in FIG. 4A, the heat insulating film 4 is formed on a front surface of the silicon substrate 2. However, as the silicon substrate 2, that which is thicker in thickness than the silicon substrate 2 at a final stage is used. Specifically, the heat insulating film 4 constituted of a silicon oxide film is formed on the front surface of the silicon substrate 2.

Next, as shown in FIG. 4B, a lower electrode film 31, which is a material layer of the lower electrodes 5, is formed above the heat insulating film 4. The lower electrode film 31 is constituted, for example, of a Pt/Ti laminated film having a Ti film as a lower layer and a Pt film as an upper layer. Such a lower electrode film 31 may be formed by a sputtering method.

Next, a material film (pyroelectric material film) 32 of the pyroelectric films 6 is formed on an entire surface above the lower electrode film 31. Specifically, the pyroelectric material film 32 is formed, for example, by the sol-gel method. Such a pyroelectric material film 32 is constituted of a sintered body of metal oxide crystal grains.

Next, an upper electrode film 33, which is a material of the upper electrodes 7, is formed on an entire surface of the pyroelectric material film 32. The upper electrode film 33 is constituted, for example, of an IrO$_2$/Ir laminated film having an IrO$_2$ film as a lower layer and an Ir layer as an upper layer. Such an upper electrode film 33 may be formed by the sputtering method.

Figure 4C:
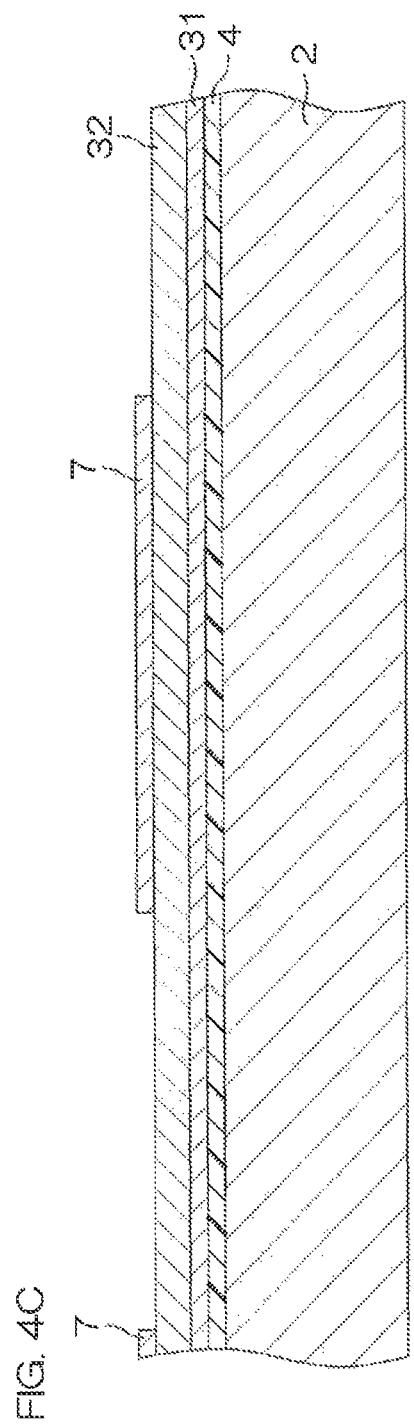
FIG. 4C is a sectional view of a step subsequent to that of FIG. 4B.

Next, as shown in FIG. 4C to FIG. 4E, patterning of the upper electrode film 33, the pyroelectric material film 32, and the lower electrode film 31 is performed. First, a resist mask with a pattern of the upper electrodes 7 is formed by photolithography. Then, as shown in FIG. 4C, the upper electrode film 33 is etched using the resist mask as a mask to form the upper electrodes 7 of the predetermined pattern.

Next, after peeling off the resist mask, a resist mask with a pattern of the pyroelectric films 6 is formed by photolithography. Then, as shown in FIG. 4D, the pyroelectric material film 32 is etched using the resist mask as a mask to form the pyroelectric films 6 of the predetermined pattern.

Next, after peeling off the resist mask, a resist mask with a pattern of the lower electrodes 5 is formed by photolithography. Then, as shown in FIG. 4E, the lower electrode film 31 is etched using the resist mask as a mask to form the lower electrodes 5 of the predetermined pattern. The lower electrodes 5, each constituted of the main electrode portions 5A, the lead-out portions 5B, and the wiring portion 5C, are thereby formed. The pyroelectric elements 10, each constituted of the main electrode portion 5A of the lower electrode 5, the pyroelectric film 6, and the upper electrode 7, are thereby formed.

Figure 4F:
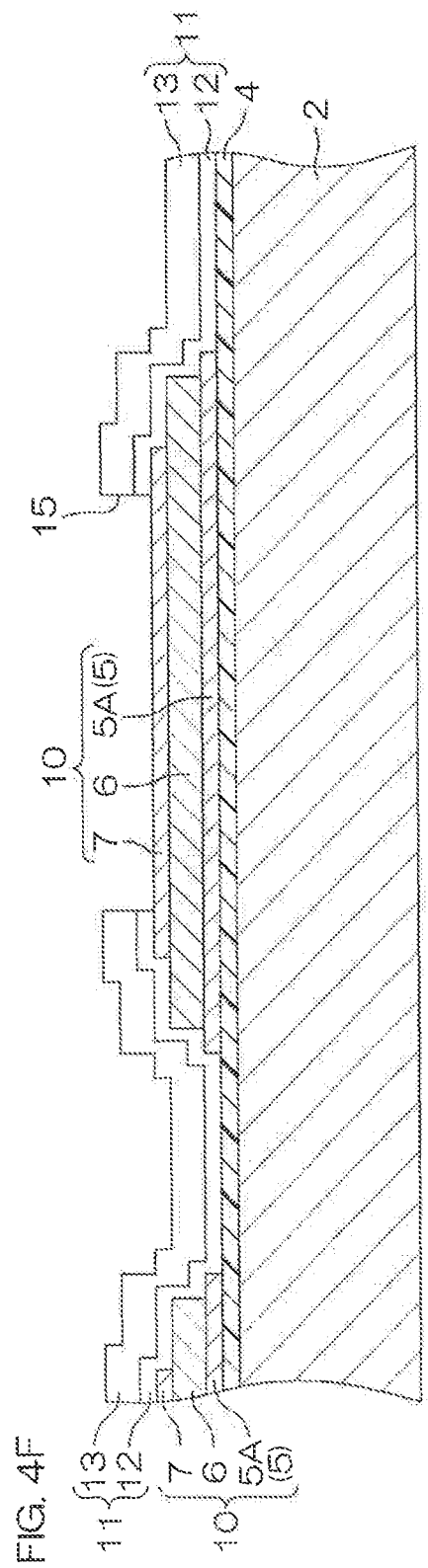
FIG. 4F is a sectional view of a step subsequent to that of FIG. 4E.

Next, after peeling off the resist mask, the hydrogen barrier film 12 covering the entire surface is formed as shown in FIG. 4F. The hydrogen barrier film 12 is, for example, an Al$_2$O$_3$ film formed by the sputtering method. The insulating film 13 is thereafter formed on an entire surface above the hydrogen barrier film 12. The insulating film 13 is, for example, an SiO$_2$ film. The covering film 11, constituted of the hydrogen barrier film 12 and the insulating film 13, is thereby formed. Subsequently, the penetrating holes (contact holes) 15 are formed by successively etching the insulating film 13 and the hydrogen barrier film 12.

Next, as shown in FIG. 4G, a wiring film constituting the wirings 14 is formed by the sputtering method above the insulating film 13 (covering film 11), including interiors of the penetrating holes 15. Thereafter, the wiring film is patterned by photolithography and etching to form the wirings 14.

Figure 4H:
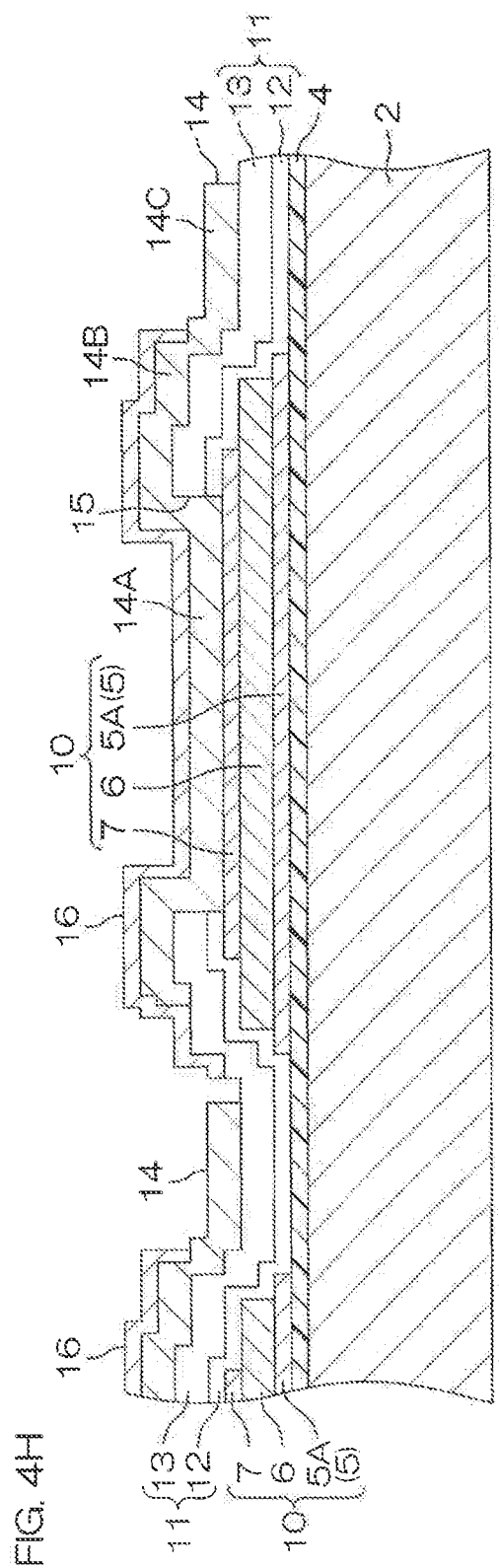
FIG. 4H is a sectional view of a step subsequent to that of FIG. 4G.
Figure 4:
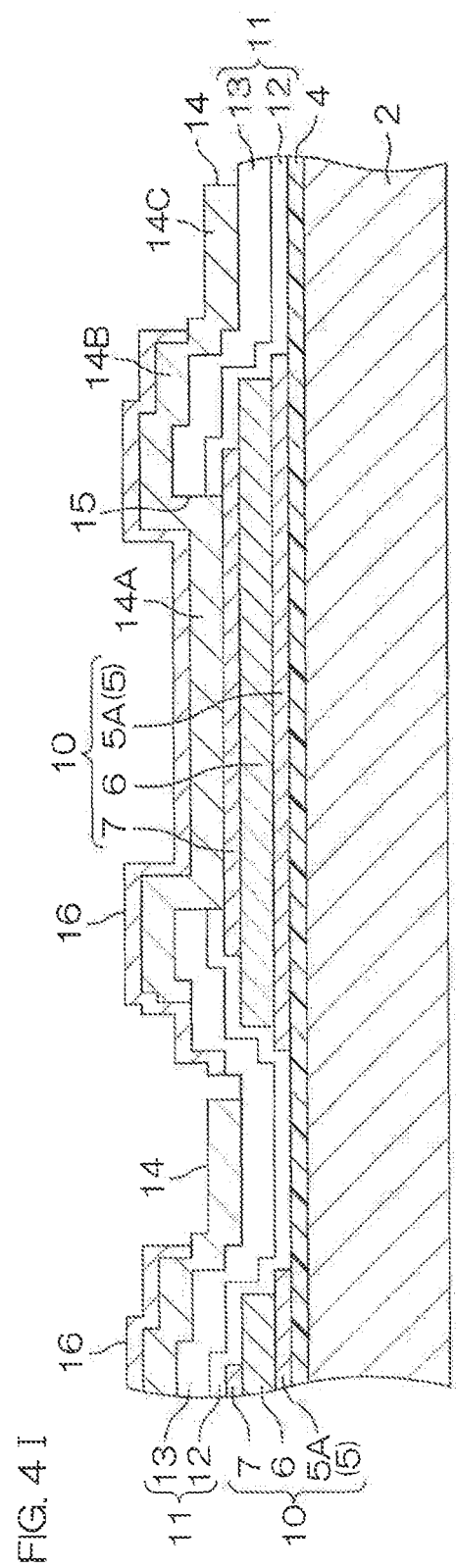
FIG. 4B is a sectional view of a step subsequent to that of FIG. 4A.
FIG. 4D is a sectional view of a step subsequent to that of FIG. 4C.
FIG. 4E is a sectional view of a step subsequent to that of FIG. 4D.
FIG. 4G is a sectional view of a step subsequent to that of FIG. 4F.
FIG. 4I is a sectional view of a step subsequent to that of FIG. 4H.
FIG. 4J is a sectional view of a step subsequent to that of FIG. 4I.
FIG. 4K is a sectional view of a step subsequent to that of FIG. 4J.

Next, a titanium layer, which is a material of the optical filter layers 16, is formed on surfaces of the insulating film 13 (covering film 11) and the wirings 14. Thereafter, the titanium layer is patterned by photolithography and etching to form the filter layers 16 as shown in FIG. 4H. Next, as shown in FIG. 4I, the silicon substrate 2 is made thin by the silicon substrate 2 being ground from the rear surface.

Figure 5:
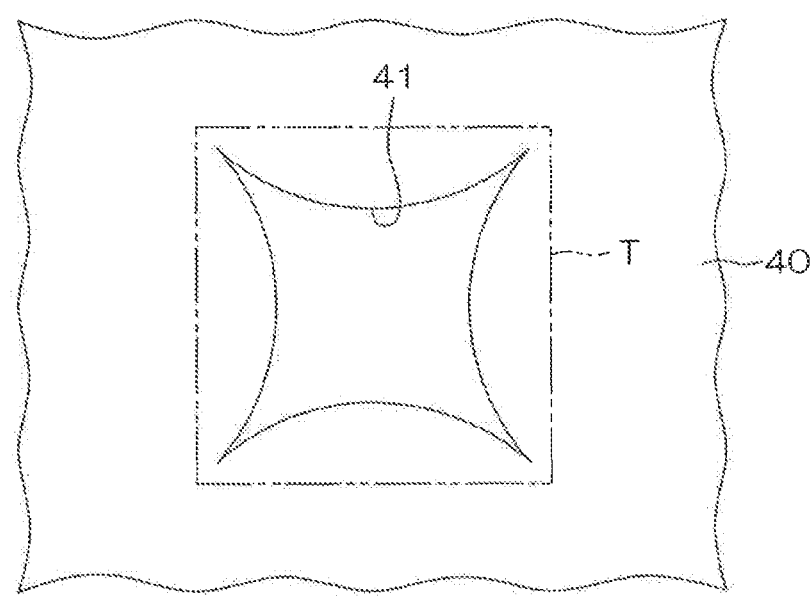
FIG. 5 is a bottom view of a portion of a resist mask used in the steps of FIG. 4J and FIG. 4K.

Next, as shown in FIG. 4J and FIG. 4K, the cavities 3 are formed in the silicon substrate 2. In the present preferred embodiment, each cavity 3 is formed so that a transverse sectional shape of a processing ending end side (heat insulating film side) of the cavity 3 will be a quadrilateral shape. In other words, a target shape of a transverse section of the processing ending end side (heat insulating film side) of the cavity 3 is a regular quadrilateral. First, as shown in FIG. 4J, a resist mask 40, having penetrating holes 41, is formed by photolithography on a rear surface of the silicon substrate 2. FIG. 5 is a plan view of a portion of the resist mask 40. A planar shape (transverse sectional shape) of each penetrating hole 41 is formed to a shape with which its respective sides are curved to inwardly convex arcuate shapes with respect to the target shape (the regular quadrilateral indicated by alternate long and two short dashes lines T in FIG. 5) of the transverse section at the processing ending end side of the corresponding cavity 3.

Next, in the state where the resist mask 40 is formed on the rear surface of the silicon substrate 2, dry etching is applied to the silicon substrate 2. For example, plasma etching is used as the dry etching. The cavities 3 are thereby formed in the silicon substrate 2 as shown in FIG. 4K.

Figure 6A:
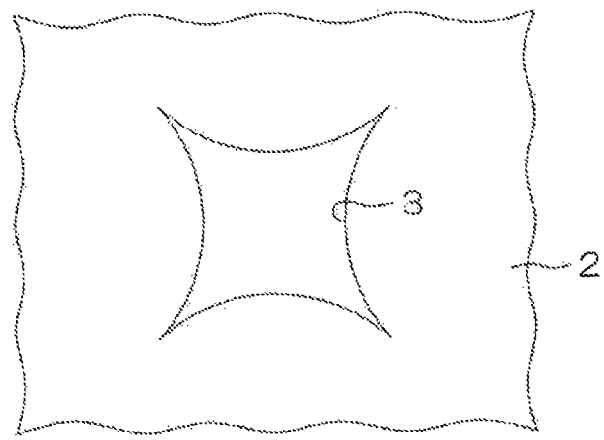
FIG. 6A is a bottom view of a bottom surface shape at a processing starting end side of a cavity.
Figure 6B:
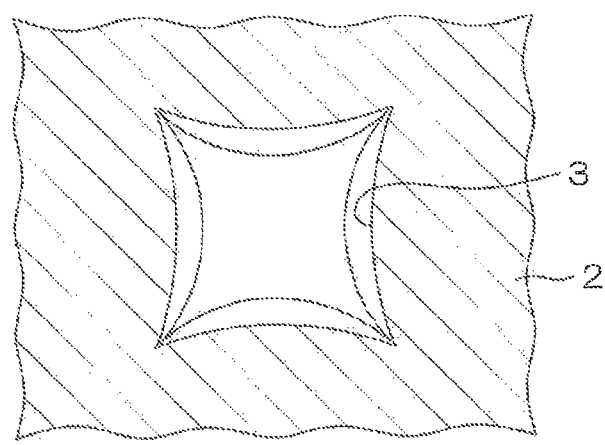
FIG. 6B is a sectional view taken along VIB-VIB in FIG. 4K.
Figure 6C:
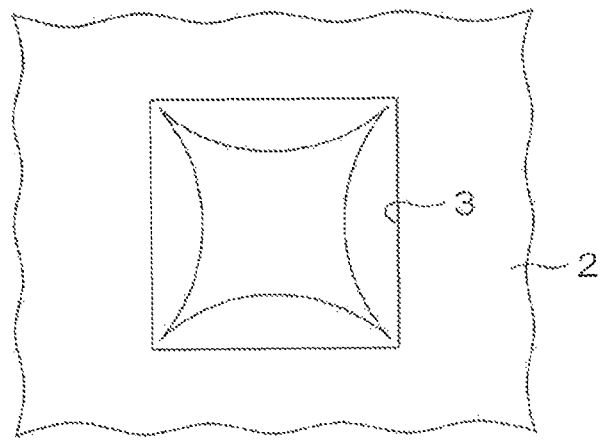
FIG. 6C is a plan view of a planar shape at a processing ending end side of the cavity.

FIG. 6A is a bottom view of a bottom surface shape at a processing starting end side (the substrate 2 rear surface side) of a cavity 3. FIG. 6B is a sectional view taken along VIB-VIB in FIG. 4K. That is, FIG. 6B is a sectional view of a transverse sectional shape at a center-of-length portion (center-of-depth portion) of the cavity 3. FIG. 6C is a plan view of a planar shape at a processing ending end side (the substrate 2 front surface side) of the cavity 3.

As shown in FIG. 5, the transverse sectional shape of each penetrating hole 41 formed in the resist mask 40 is formed to the shape with which its respective sides are curved to inwardly convex arcuate shapes with respect to the target shape T of the transverse section at the processing ending end side of the corresponding cavity 3. Therefore, as shown in FIG. 6A, the bottom surface shape at the processing starting end side (the substrate 2 rear surface side) of the cavity 3 is substantially the same shape as the transverse sectional shape of the penetrating hole 41. As the etching progresses, inward projection amounts of the respective arcuate shaped sides of the transverse sectional shape of the cavity 3 decrease as shown, for example, in FIG. 6B. That is, as the etching progresses, the transverse sectional shape of the cavity 3 approaches the regular quadrilateral that is the target shape T. At the processing ending end side (the substrate 2 front surface side) of the cavity 3, the planar shape is substantially the same shape as the regular quadrilateral that is the target shape T as shown in FIG. 6C.

In other words, in comparison to the transverse sectional shape at the processing starting end side (the substrate 2 rear surface side) of the cavity 3, the transverse sectional shape at the processing ending end side of the cavity 3 is a shape that is closer to the regular quadrilateral that is the target shape T. In the present preferred embodiment, the inward projection amounts of the respective arcuate shaped sides of the transverse sectional shape of the penetrating hole 41 are determined so that the transverse sectional shape at the processing ending end side (the substrate 2 front surface side) of the cavity 3 will be a shape that is substantially the same as the regular quadrilateral that is the target shape T.

Lastly, the resist mask 40 is peeled off. The infrared sensor 1 shown in FIG. 3 is thereby obtained.

With the preferred embodiment described above, the transverse sectional shape at the processing ending end side of each cavity 3 can be made a shape close to a target shape (a predetermined polygon).

Although with the preferred embodiment described above, the target shape of the transverse section at the processing ending end side of each cavity 3 is a regular quadrilateral, the target shape may be a polygon other than a regular quadrilateral, such as a triangle, a quadrilateral other than a regular quadrilateral, a pentagon, or a hexagonal shape. When the target shape of the transverse section at the processing ending end side of each cavity 3 is a polygon, each penetrating hole formed in the resist mask for forming the cavities is formed to a shape with which respective sides thereof are curved to inwardly convex arcuate shapes with respect to the polygon that is the target shape.

Figure 7A:
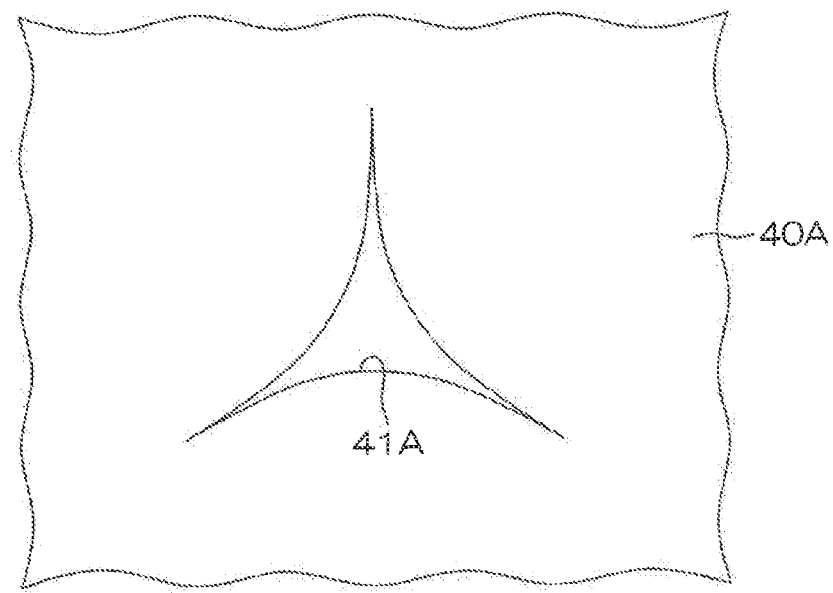
FIG. 7A is a bottom view of a portion of a resist mask used in a case where a target planar shape at a processing ending end side of a cavity is a regular triangle.
Figure 7B:
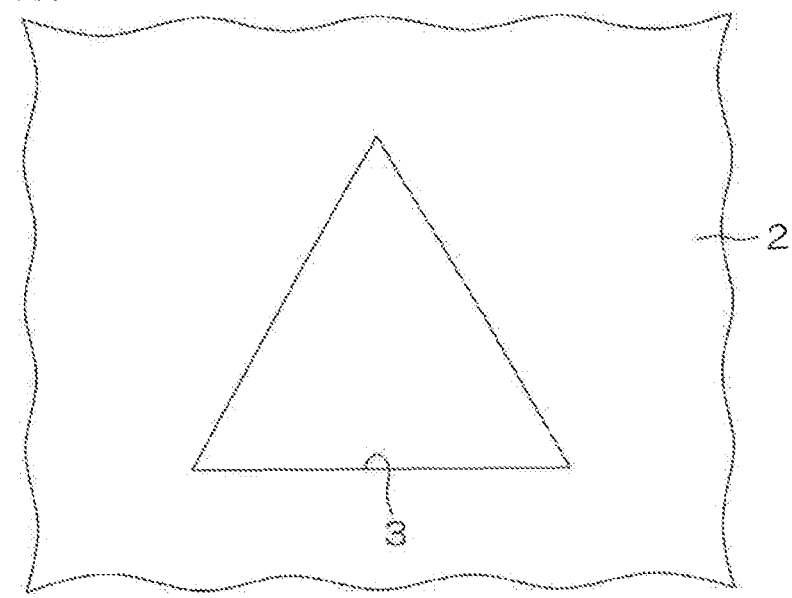
FIG. 7B is a plan view of a planar shape at a processing ending end side of a cavity obtained by applying dry etching to a substrate using the resist mask shown in FIG. 7A.

For example, if the target shape of the transverse section at the processing ending end side of each cavity 3 is a regular triangle, a resist mask 40A having a penetrating hole 41A such as shown in FIG. 7A is used. The penetrating hole 41A is formed to a shape with which respective sides thereof are curved to inwardly convex arcuate shapes with respect to the regular triangle that is the target shape. When dry etching is applied to the substrate 2 using the resist mask 40A shown in FIG. 7A, the planar shape at the processing ending end side of the cavity 3 becomes a shape such as shown in FIG. 7B.

Figure 8B:
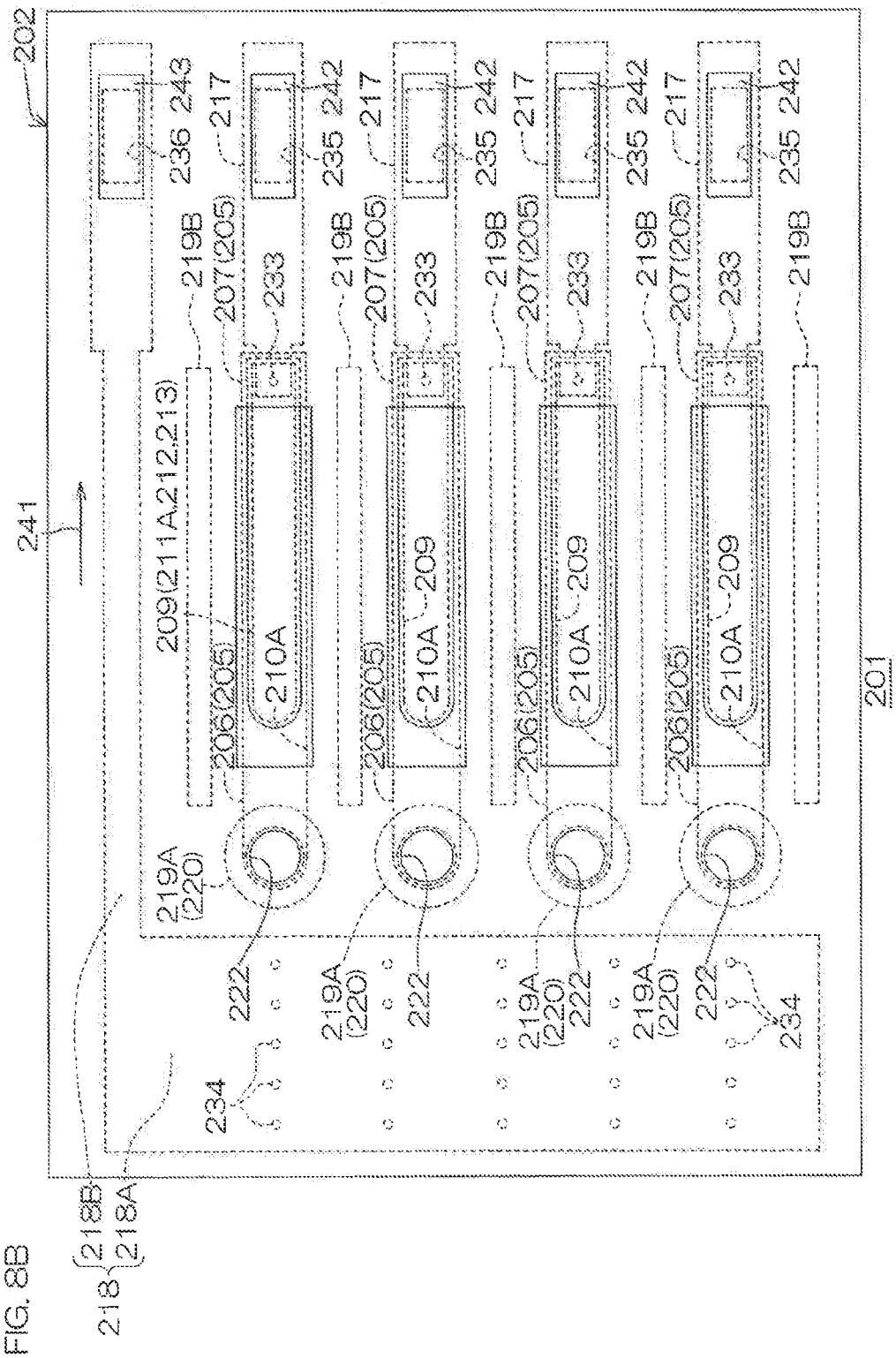
FIG. 8B is an illustrative plan view of the main portion of the inkjet printing head and is a plan view with a protective substrate omitted.
Figure 9:
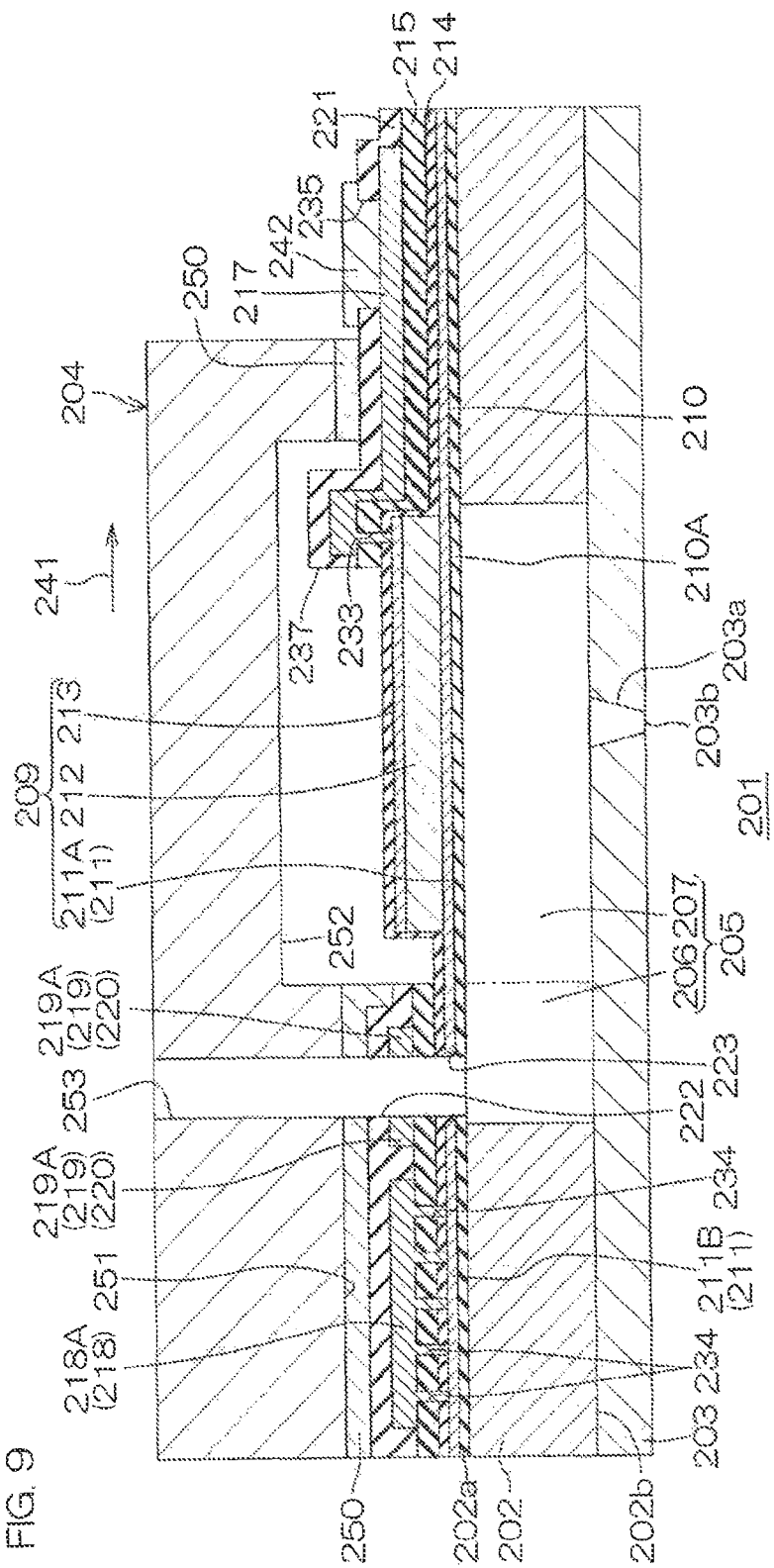
FIG. 9 is an illustrative sectional view taken along line IX-IX in FIG. 8A.
Figure 10:
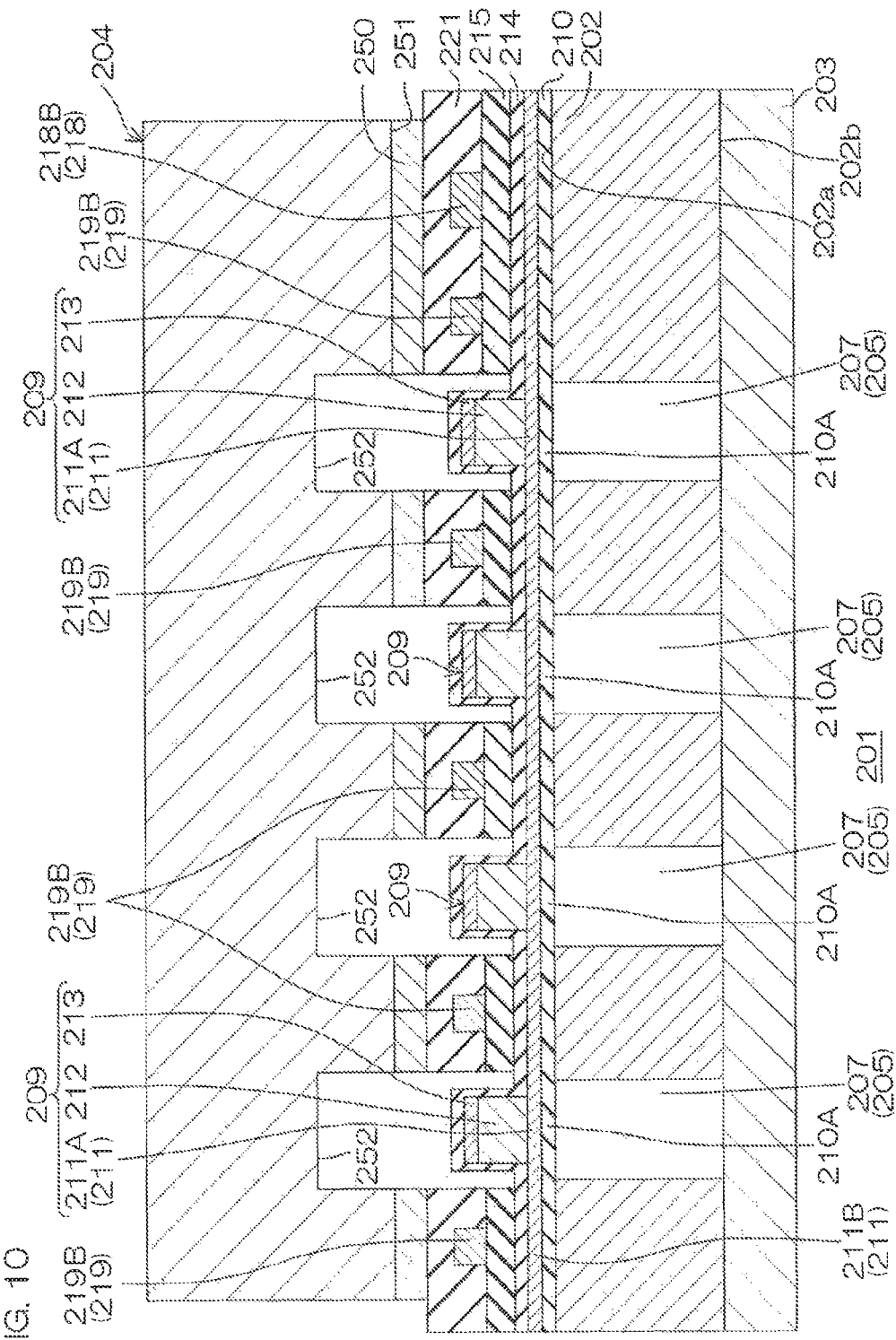
FIG. 10 is an illustrative enlarged sectional view of a portion of a section taken along line X-X in FIG. 8A.
Figure 11:
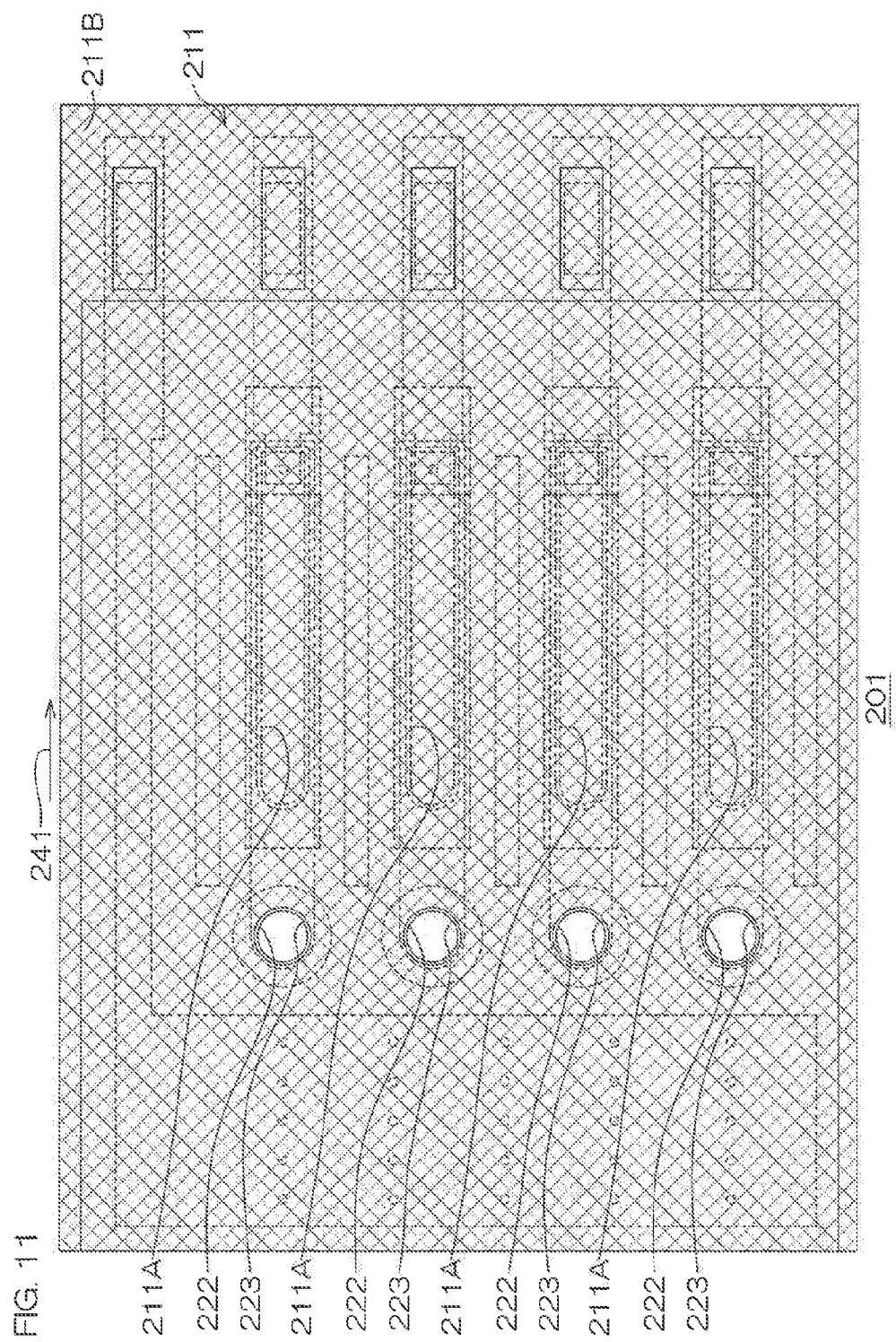
FIG. 11 is an illustrative plan view of a pattern example of a lower electrode of the inkjet printing head.

FIG. 8A is an illustrative plan view for describing the arrangement of a main portion of an inkjet printing head to which a substrate having a hole according to a second preferred embodiment of the present invention is applied. FIG. 8B is an illustrative plan view of the main portion of the inkjet printing head and is a plan view with a protective substrate omitted. FIG. 9 is an illustrative sectional view taken along line IX-IX in FIG. 8A. FIG. 10 is an illustrative enlarged sectional view of a portion of a section taken along line X-X in FIG. 8A. FIG. 11 is an illustrative plan view of a pattern example of a lower electrode of the inkjet printing head.

The arrangement of an inkjet printing head 201 shall now be described in outline with reference to FIG. 9.

The inkjet printing head 201 includes an actuator substrate 202, a nozzle substrate 203, and a protective substrate 204. A movable film formation layer 210 is laminated on a front surface 202a of the actuator substrate 202. In the actuator substrate 202, ink flow passages (ink reservoirs) 205 are formed. In the present preferred embodiment, the ink flow passages 205 are formed to penetrate through the actuator substrate 202. Each ink flow passage 205 is formed to be elongate along an ink flow direction 241, which is indicated by an arrow in FIG. 9. Each ink flow passage 205 is constituted of an ink inflow portion 206 at an upstream side end portion (left end portion in FIG. 9) in the ink flow direction 241 and a pressure chamber 207 in communication with the ink inflow portion 206. In FIG. 9, a boundary between the ink inflow portion 206 and the pressure chamber 207 is indicated by an alternate long and two short dashes line.

The nozzle substrate 203 is constituted, for example, of a silicon substrate. The nozzle substrate 203 is adhered to a rear surface 202b of the actuator substrate 202. The nozzle substrate 203, together with the actuator substrate 202 and the movable film formation layer 210, defines the ink flow passages 205. More specifically, the nozzle substrate 203 defines bottom surface portions of the ink flow passages 205. The nozzle substrate 203 has ink discharge holes 203a each facing a pressure chamber 207. Each ink discharge hole 203a penetrates through the nozzle substrate 203 and has a discharge port 203b at an opposite side from the pressure chamber 207. Therefore, when a volume change occurs in a pressure chamber 207, the ink retained in the pressure chamber 207 passes through the ink discharge hole 203a and is discharged from the discharge port 203b. The ink discharge hole 203a is an example of the hole of the present invention.

Each portion of the movable film formation layer 210 that is a top roof portion of a pressure chamber 207 constitutes a movable film 210A. The movable film 210A (movable film formation layer 210) is constituted, for example, of a silicon oxide ($SiO_2$) film formed above the actuator substrate 202. The movable film 210A (movable film formation layer 210) may be constituted of a laminated film, for example, of a silicon (Si) film formed above the actuator substrate 202, a silicon oxide ($SiO_2$) film formed above the silicon film, and a silicon nitride (SiN) film formed above the silicon oxide film. In the present specification, the movable film 210A refers to a top roof portion of the movable film formation layer 210 that defines the top surface portion of the pressure chamber 207. Therefore, portions of the movable film formation layer 210 besides the top roof portions of the pressure chambers 207 do not constitute the movable film 210A.

Each movable film 210A has a thickness of, for example, 0.4 µm to 2 µm. If the movable film 210A is constituted of a silicon oxide film, the thickness of the silicon oxide film may be approximately 1.2 µm. If the movable film 210A is constituted of a laminated film of a silicon film, a silicon oxide film, and a silicon nitride film, the thickness of each of the silicon film, the silicon oxide film, and the silicon nitride film may be approximately 0.4 µm.

Each pressure chamber 207 is defined by a movable film 210A, the actuator substrate 202, and the nozzle substrate 203 and is formed to a substantially rectangular parallelepiped shape in the present preferred embodiment. The pressure chamber 207 may, for example, have a length of approximately 800 µm and a width of approximately 55 µm. Each ink inflow portion 206 is in communication with one end portion in a long direction of a pressure chamber 207.

A piezoelectric element 209 is disposed on a front surface of each movable film 210A. Each piezoelectric element 209 includes a lower electrode 211 formed above the movable film formation layer 210, a piezoelectric film 212 formed above the lower electrode 211, and an upper electrode 213 formed above the piezoelectric film 212. In other words, the piezoelectric element 209 is arranged by sandwiching the piezoelectric film 212 from above and below by the upper electrode 213 and the lower electrode 211.

The upper electrode 213 may be a single film of platinum (Pt) or may have a laminated structure, for example, in which a conductive oxide film (for example, an $IrO_2$ (iridium oxide) film) and a metal film (for example, an Ir (iridium) film) are laminated. The upper electrode 213 may have a thickness, for example, of approximately 0.2 µm.

As each piezoelectric film 212, for example, a PZT ($PbZr_xTi_{1-x}O_3$:lead zirconate titanate) film formed by a sol-gel method or a sputtering method may be applied. Such a piezoelectric film 212 is constituted of a sintered body of a metal oxide crystal. The piezoelectric film 212 is formed to be of the same shape as the upper electrode 213 in plan view. The piezoelectric film 212 has a thickness of approximately 1 µm. The overall thickness of each movable film 210A is preferably approximately the same as the thickness of the piezoelectric film 212 or approximately ⅔ the thickness of the piezoelectric film 212.

The lower electrode 211 has, for example, a two-layer structure with a Ti (titanium) film and a Pt (platinum) film being laminated successively from the movable film formation layer 210 side. Besides this, the lower electrode 211 may be formed of a single film that is an Au (gold) film, a Cr (chromium) layer, or an Ni (nickel) layer, etc. The lower electrode 211 has main electrode portions 211A, in contact with lower surfaces of the piezoelectric films 212, and an extension portion 211B extending to a region outside the piezoelectric films 212. The lower electrode 211 may have a thickness, for example, of approximately 0.2 µm.

A hydrogen barrier film 214 is formed above the extension portion 211B of the lower electrode 211 and above the piezoelectric elements 209. The hydrogen barrier film 214 is constituted, for example, of $Al_2O_3$ (alumina). The hydrogen barrier film 214 has a thickness of approximately 50 nm to 100 nm. The hydrogen barrier film 214 is provided to prevent degradation of characteristics of the piezoelectric film 212 due to hydrogen reduction.

An insulating film 215 is laminated on the hydrogen barrier film 214. The insulating film 215 is constituted, for example, of $SiO_2$ or low-hydrogen SiN, etc. The insulating film 215 has a thickness of approximately 500 nm. Upper wirings 217, a lower wiring 218, and dummy wirings 219 are formed above the insulating film 215. These wirings 217, 218, and 219 may be constituted of a metal material that includes Al (aluminum). These wirings 217, 218, and 219 have a thickness, for example, of approximately 1000 nm (1 μm).

One end portion of each upper wiring 217 is disposed above one end portion (downstream side end portion in the ink flow direction 241) of an upper electrode 213. A contact hole 233, penetrating continuously through the hydrogen barrier film 214 and the insulating film 215, is formed between the upper wiring 217 and the upper electrode 213. The one end portion of the upper wiring 217 enters into the contact hole 233 and is connected to the upper electrode 213 inside the contact hole 233. From above the upper electrode 213, the upper wiring 217 crosses an outer edge of the pressure chamber 207 and extends outside the pressure chamber 207.

The lower wiring 218 is disposed above the extension portion 211B of the lower electrode 211 at an opposite side from the pressure chambers 207 with respect to the ink inflow portions 206 of the ink flow passages 205. A plurality of contact holes 234, penetrating continuously through the hydrogen barrier film 214 and the insulating film 215, are formed between the lower wiring 218 and the extension portion 211B of the lower electrode 211. The lower wiring 218 enters into the contact holes 234 and is connected to the extension portion 211B of the lower electrode 211 inside the contact holes 234.

The dummy wirings 219 are not electrically connected to either of the upper wirings 217 and the lower wiring 218 and are electrically insulated wirings. The dummy wirings 219 are formed in the same process as a process in which the upper wirings 217 and the lower wiring 218 are formed.

A passivation film 221, covering the wirings 217, 218, and 219 and the insulating film 215 is formed above the insulating film 215. The passivation film 221 is constituted, for example, of SiN (silicon nitride). The passivation film 221 may have a thickness, for example, of approximately 800 nm.

Pad openings 235 that expose portions of the upper wirings 217 are formed in the passivation film 221. The pad openings 235 are formed in a region outside the pressure chambers 207 and are formed, for example, at tip portions (end portions at opposite sides from the portions of contact with the upper electrodes 213) of the upper wirings 217. Pads 242 that cover the pad openings 235 are formed above the passivation film 221. The pads 242 enter into the pad openings 235 and are connected to the upper wirings 217 inside the pad openings 235.

Ink supply penetrating holes 222, penetrating through the passivation film 221, the insulating film 215, the hydrogen barrier film 214, the lower electrode 211, and the movable film formation layer 210 are formed at positions corresponding to end portions of the ink flow passages 205 at the ink inflow portion 206 sides. Penetrating holes 223, each including an ink supply penetrating hole 222 and being larger than the ink supply penetrating hole 222, are formed in the lower electrode 211. The hydrogen barrier film 214 enters into gaps between the penetrating holes 223 in the lower electrode 211 and the ink supply penetrating holes 222. The ink supply penetrating holes 222 are in communication with the ink inflow portions 206.

The protective substrate 204 is constituted, for example, of a silicon substrate. The protective substrate 204 is disposed above the actuator substrate 202 so as to cover the piezoelectric elements 209. The protective substrate 204 is bonded to the passivation film 221 via an adhesive 250. The protective substrate 204 has housing recesses 252 in a facing surface 251 that faces a front surface 202a of the actuator substrate 202. The piezoelectric elements 209 are housed inside the housing recesses 252. Further, the protective substrate 204 has formed therein ink supply passages 253 that are in communication with the ink supply penetrating holes 222. The ink supply passages 253 penetrate through the protective substrate 204. An ink tank (not shown) storing ink is disposed above the protective substrate 204.

Each piezoelectric element 209 is formed at a position facing a pressure chamber 207 across a movable film 210A. That is, the piezoelectric element 209 is formed to contact a front surface of the movable film 210A at an opposite side from the pressure chamber 207. Each pressure chamber 207 is filled with ink by the ink being supplied from the ink tank to the pressure chamber 207 through an ink supply passage 253, an ink supply penetrating hole 222, and an ink inflow portion 206. The movable film 210A defines a top surface portion of the pressure chamber 207 and faces the pressure chamber 207. The movable film 210A is supported by portions of the actuator substrate 202 at a periphery of the pressure chamber 207 and has flexibility enabling deformation in a direction facing the pressure chamber 207 (in other words, in the thickness direction of the movable film 210A).

The upper wirings 217 and the lower wiring 218 are connected to a drive circuit (not shown). Specifically, the pads 242 of the upper wirings 217 and the drive circuit are connected via a connecting metal member (not shown). As shall be described later, a pad 243 (see FIG. 8A) is connected to the lower wiring 218. The pad 243 of the lower wiring 218 and the drive circuit are connected via a connecting metal member (not shown). When a drive voltage is applied from the drive circuit to a piezoelectric element 209, the piezoelectric film 212 deforms due to an inverse piezoelectric effect. The movable film 210A is thereby made to deform together with the piezoelectric element 209 to bring about a volume change of the pressure chamber 207 and the ink inside the pressure chamber 207 is pressurized. The pressurized ink passes through the ink discharge hole 203a and is discharged as microdroplets from the discharge port 203b.

The arrangement of the inkjet printing head 201 shall now be described in more detail with reference to FIG. 8A to FIG. 11.

A plurality of the ink flow passages 205 (pressure chambers 207) are formed as stripes extending parallel to each other in the actuator substrate 202. The piezoelectric element 209 is disposed respectively in each of the plurality of ink flow passages 205. The ink supply penetrating holes 222 are provided respectively for each of the plurality of ink flow passages 205. The housing recesses 252 and the ink supply passages 253 in the protective substrate 204 are provided respectively for each of the plurality of ink flow passages 205.

The plurality of ink flow passages 205 are formed at equal intervals that are minute intervals (for example, of approximately 30 μm to 350 μm) in a width direction thereof. Each ink flow passage 205 is elongate along the ink flow direction 241. Each ink flow passage 205 is constituted of an ink inflow portion 206 in communication with an ink supply penetrating hole 222 and the pressure chamber 207 in communication with the ink inflow portion 206. In plan view, the pressure chamber 207 has an oblong shape that is elongate along the ink flow direction 241. That is, the top surface portion of the pressure chamber 207 has two side edges along the ink flow direction 241 and two end edges along a direction orthogonal to the ink flow direction 241. In plan view, the ink inflow portion 206 has substantially the same width as the pressure chamber 207. An inner surface of an end portion of the ink inflow portion 206 at an opposite side from the pressure chamber 207 is formed to a semicircle in plan view. The ink supply penetrating hole 222 is circular in plan view (see especially FIG. 8B).

Each piezoelectric element 209 has, in plan view, a rectangular shape that is long in a long direction of a pressure chamber 207 (movable film 210A). A length in a long direction of the piezoelectric element 209 is shorter than a length in the long direction of the pressure chamber 207 (movable film 210A). As shown in FIG. 8B, respective end edges along a short direction of the piezoelectric element 209 are disposed at inner sides at predetermined intervals respectively from respective corresponding end edges of the movable film 210A. Also, a width in the short direction of the piezoelectric element 209 is narrower than a width in a short direction of the movable film 210A. Respective side edges along the long direction of the piezoelectric element 209 are disposed at inner sides at predetermined intervals from respective corresponding side edges of the movable film 210A.

The lower electrode 211 is formed on substantially an entirety of the front surface of the movable film formation layer 210 (see especially FIG. 11). The lower electrode 211 is a common electrode used in common for the plurality of piezoelectric elements 209. The lower electrode 211 includes the main electrode portions 211A of rectangular shape in plan view that constitute the piezoelectric elements 209 and the extension portion 211B led out from the main electrode portions 211A in directions along the front surface of the movable film formation layer 210 to extend outside the peripheral edges of the top surface portions of the pressure chambers 207.

A length in a long direction of each main electrode portion 211A is shorter than the length in the long direction of each movable film 210A. Respective end edges of the main electrode portion 211A are disposed at inner sides at predetermined intervals respectively from the respective corresponding end edges of the movable film 210A. Also, a width in a short direction of the main electrode portion 211A is narrower than the width of the movable film 210A in the short direction. Respective side edges of the main electrode portion 211A are disposed at inner sides at predetermined intervals from the respective corresponding side edges of the movable film 210A. The extension portion 211B is a region among the entire region of the lower electrode 211 that excludes the main electrode portions 211A.

In plan view, the upper electrodes 213 are formed to rectangular shapes of the same pattern as the main electrode portions 211A of the lower electrode 211. That is, a length in a long direction of each upper electrode 213 is shorter than the length in the long direction of each movable film 210A. Respective end edges of the upper electrode 213 are disposed at inner sides at predetermined intervals respectively from the respective corresponding end edges of the movable film 210A. Also, a width in a short direction of the upper electrode 213 is narrower than the width in the short direction of the movable film 210A. Respective side edges of the upper electrode 213 are disposed at inner sides at predetermined intervals from the respective corresponding side edges of the movable film 210A.

In plan view, the piezoelectric films 212 are formed to rectangular shapes of the same pattern as the upper electrodes 213. That is, a length in a long direction of each piezoelectric film 212 is shorter than the length in the long direction of each movable film 210A. Respective end edges of the piezoelectric film 212 are disposed at inner sides at predetermined intervals respectively from the respective corresponding end edges of the movable film 210A. Also, a width in a short direction of the piezoelectric film 212 is narrower than the width in the short direction of the movable film 210A. Respective side edges of the piezoelectric film 212 are disposed at inner sides at predetermined intervals from the respective corresponding side edges of the movable film 210A. A lower surface of the piezoelectric film 212 contacts an upper surface of the main electrode portion 211A of the lower electrode 211 and an upper surface of the piezoelectric film 212 contacts a lower surface of the upper electrode 213.

Each upper wiring 217 extends from an upper surface of one end portion of a piezoelectric element 209 and along an end surface of the piezoelectric element 209 continuous to the upper surface and extends further along the front surface of the extension portion 211B of the lower electrode 211 in a direction along the ink flow direction 241. The tip portion of the upper wiring 217 is disposed further downstream in the ink flow direction 241 than a downstream side end of the protective substrate 204. The pad openings 235 that expose central portions of tip portion front surfaces of the upper wirings 217 are formed in the passivation film 221. The pads 242 are provided on the passivation film 221 so as to cover the pad openings 235. The pads 242 are connected to the upper wirings 217 inside the pad openings 235.

In plan view, the lower wiring 218 has a rectangular main wiring portion 218A that is long in a direction orthogonal to the ink flow direction 241 and a lead portion 218B extending along the ink flow direction 241 from one end portion of the main wiring portion 218A. A tip portion of the lead portion 218B is disposed further downstream in the ink flow direction 241 than the downstream side end of the protective substrate 204. The lower wiring 218 enters into the plurality of contact holes 234 and is connected to the extension portion 211B of the lower electrode 211 inside the contact holes 234. A pad opening 236 that exposes a central portion of a tip portion front surface of the lead portion 218B is formed in the passivation film 221. The pad 243 is provided above the passivation film 221 so as to cover the pad opening 236. The pad 243 is connected to the lead portion 218B inside the pad opening 236.

FIG. 14 is a bottom view of a main portion of the protective substrate as viewed from the actuator substrate side of the inkjet printing head.

As shown in FIG. 8A, FIG. 10, and FIG. 14, in the facing surface 251 of the protective substrate 204, the plurality of housing recesses 252 are formed in parallel at intervals in a direction orthogonal to the ink flow direction 241. In plan view, the plurality of housing recesses 252 are disposed at positions facing the plurality of pressure chambers 207. With respect to the respective housing recesses 252, the ink supply passages 253 are disposed at upstream sides in the ink flow direction 241. In plan view, each housing recess 252 is formed to a rectangular shape slightly larger than the pattern of the upper electrode 213 of the corresponding piezoelectric element 209. The corresponding piezoelectric element 209 is housed in each housing recess 252.

In plan view, the ink supply passages 253 of the protective substrate 204 have circular shapes of the same pattern as the ink supply penetrating holes 222 at the actuator substrate 202 side. In plan view, the ink supply passages 253 are matched with the ink supply penetrating holes 222.

In plan view, the dummy wirings 219 include first dummy wirings 219A of circular annular shapes that surround the ink supply passages 253 (ink supply penetrating holes 222). Above the actuator substrate 202, the first dummy wirings 219A are disposed in regions facing regions of the facing surface 251 of the protective substrate 204 peripheral to the ink supply passages 253. A width of each first dummy wiring 219A (difference between an inner diameter and an outer diameter of each first dummy wiring 219A) is preferably not less than ⅓ a diameter of each ink supply passage 253. Upper surfaces of the first dummy wirings 219A are flat. Each first dummy wiring 219A constitutes a base 220 that supports the protective substrate 204 and increases adhesion with the facing surface of the protective substrate 204.

The dummy wirings 219 further include second dummy wirings 219B of elongate rectangular shapes that are formed at width central portions of regions between adjacent pressure chambers 207 and at outward sides of the pressure chambers 207 at respective outer sides of the set of plurality of pressure chambers and extend in the direction along the ink flow direction 241. Upper surfaces of the second dummy wirings 219B are flat. Each second dummy wiring 219B constitutes a base that supports the protective substrate 204 and increases adhesion with the facing surface of the protective substrate 204.

In bonding the protective substrate 204 to the actuator substrate 202, the protective substrate 204 is pressed against the actuator substrate 202 in a state where the adhesive 250 is coated on a portion of bonding of the actuator substrate 202 and the protective substrate 204. In this process, the facing surface 251 of the protective substrate 204 is pressed via the passivation film 221 against the first dummy wirings 219A and the second dummy wirings 219B that are the bases with flat upper surfaces. The facing surface 251 of the protective substrate 204 is thus bonded firmly via the passivation film 221 and the adhesive 250 to the upper surfaces of the first dummy wirings 219A and the second dummy wirings 219B. Defective adhesion is thus made unlikely to occur at the portion of bonding of the facing surface 251 of the protective substrate 204 and the actuator substrate 202.

In the present second preferred embodiment, by the first dummy wirings 219A (bases 220) of circular annular shapes surrounding the ink supply passages 253 (ink supply penetrating holes 222) being provided at the actuator substrate 202 side, occurrence of defective bonding between the actuator substrate 202 and lower surfaces of wall portions of the protective substrate 204 between the housing recesses 252 and the ink supply passages 253 can be suppressed. Leakage of ink into a housing recess 252 from an ink supply passage 253 can thereby be suppressed.

Figure 12:
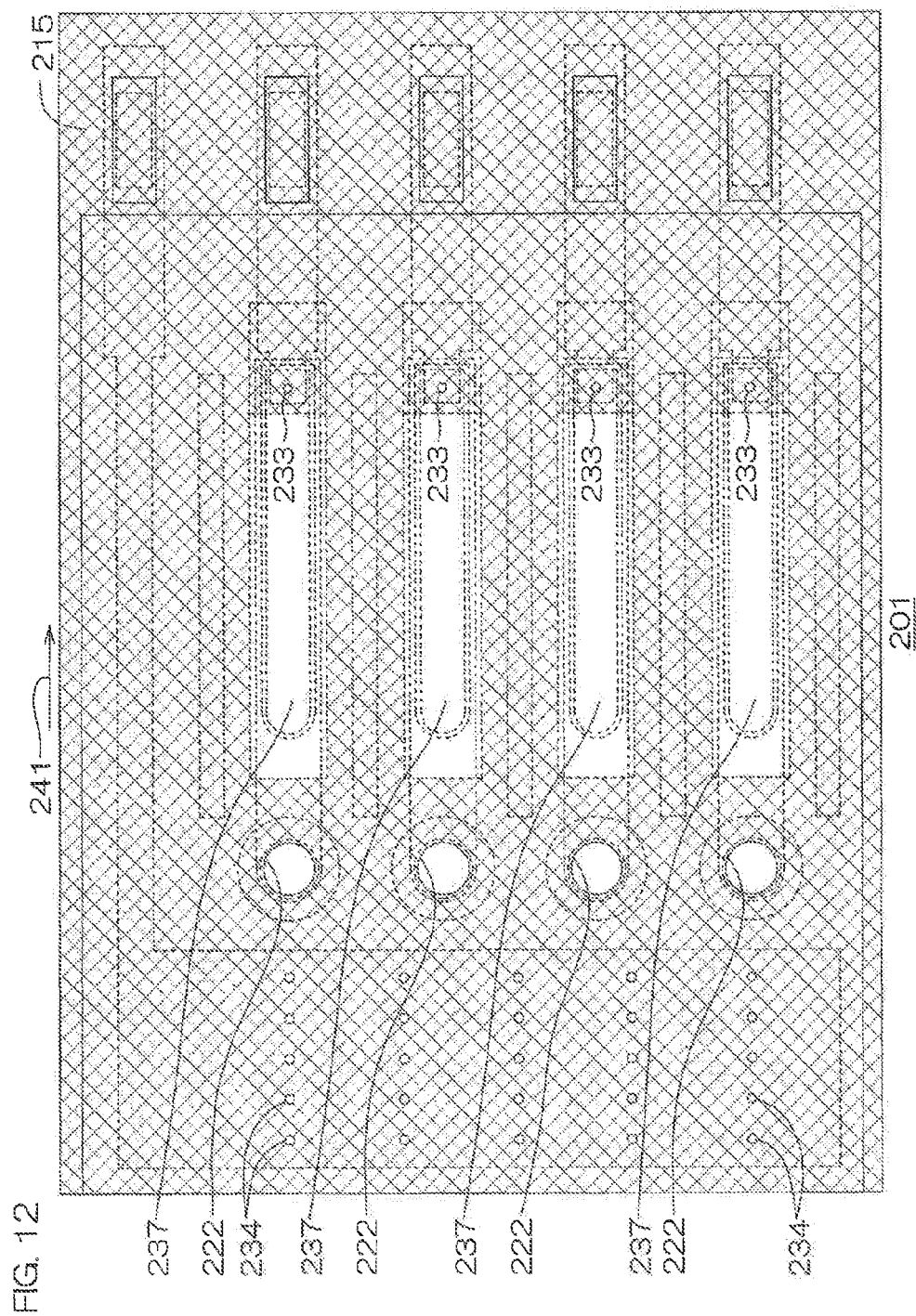
FIG. 12 is an illustrative plan view of a pattern example of an insulating film of the inkjet printing head.
Figure 13:
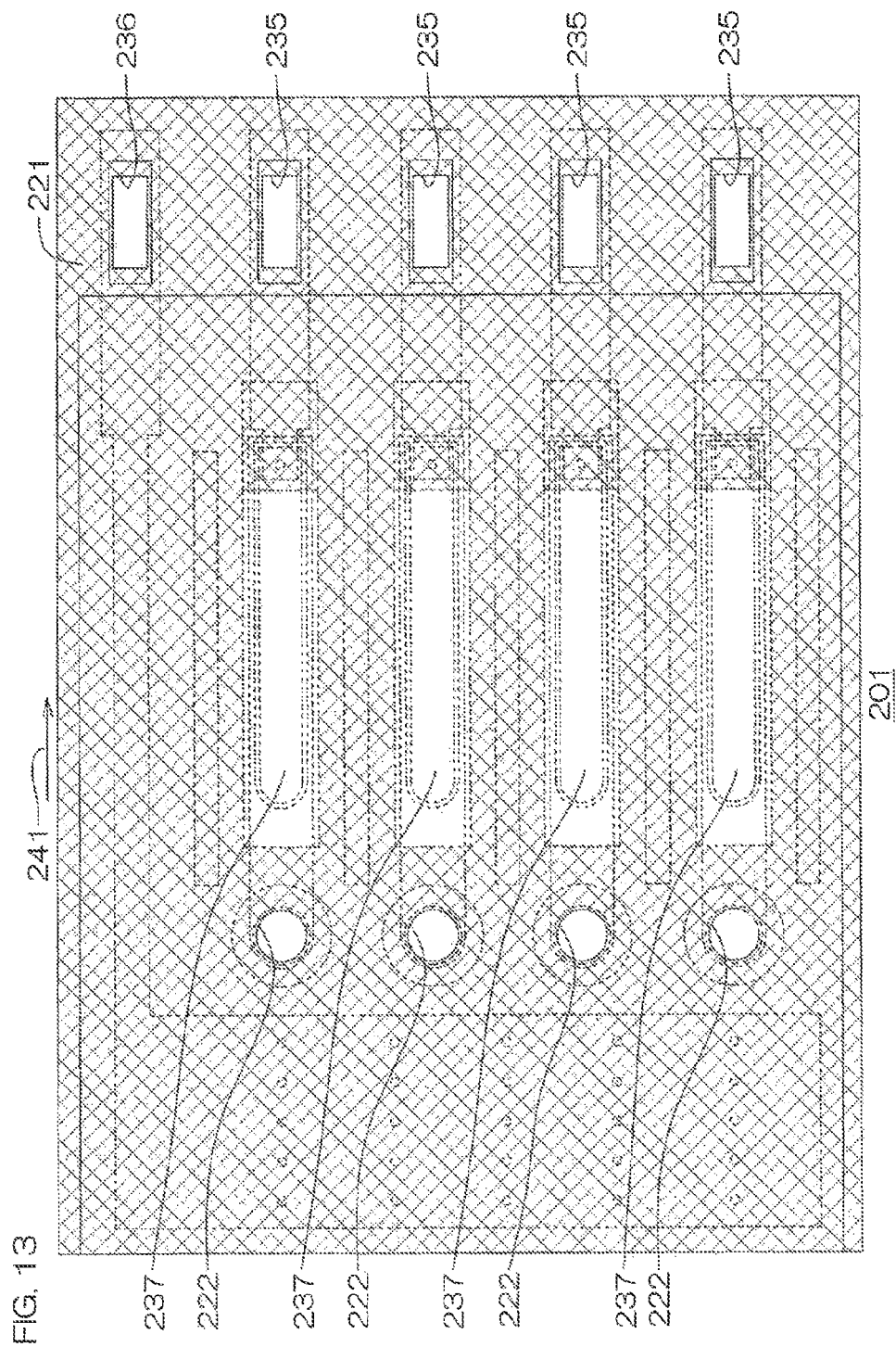
FIG. 13 is an illustrative plan view of a pattern example of a passivation film of the inkjet printing head.

FIG. 12 is an illustrative plan view of a pattern example of the insulating film of the inkjet printing head. FIG. 13 is an illustrative plan view of a pattern example of the passivation film of the inkjet printing head.

In the present second preferred embodiment, above the actuator substrate 202, the insulating film 215 and the passivation film 221 are formed on substantially an entirety of a region of the protective substrate 204 outside the housing recesses 252 in plan view. However, in this region, the ink supply penetrating holes 222 and the contact holes 234 are formed in the insulating film 215. In this region, the ink supply penetrating holes 222 and the pad openings 235 and 236 are formed in the passivation film 221.

In the regions of the protective substrate 204 inside the housing recesses 252, the insulating film 215 and the passivation film 221 are formed just in one end portions (upper wiring regions) in which the upper wirings 217 are present. In each of these regions, the passivation film 221 is formed to cover an upper surface and a side surface of an upper wiring 217 above the insulating film 215. In other words, in the insulating film 215 and the passivation film 221, openings 237 are formed in regions, within the inner side regions of the housing recesses 252 in plan view, that exclude the upper wiring regions. The contact holes 233 are further formed in the insulating film 215.

In the present preferred embodiment, in a region at the inner side of the peripheral edge of each pressure chamber 207 in plan view, the insulating film 215 and the passivation film 221 are formed just in the upper wiring region in which an upper wiring 217 is present. Therefore, most of the side surface and the upper surface of each piezoelectric element 209 are not covered by the insulating film 215 and the passivation film 221. Displacement of each movable film 210A can thereby be increased in comparison to a case where entireties of the side surface and the upper surface of the piezoelectric element 209 are covered by the insulating film and the passivation film.

FIG. 15A to FIG. 15M are sectional views of an example of a manufacturing process of the inkjet printing head 201 and show a section corresponding to FIG. 9.

First, as shown in FIG. 15A, the movable film formation layer 210 is formed on the front surface 202a of the actuator substrate 202. However, as the actuator substrate 202, that which is thicker than the thickness of the actuator substrate 202 at the final stage is used. Specifically, a silicon oxide film (for example, of 1.2 μm thickness) is formed on the front surface of the actuator substrate 202. If the movable film formation layer 210 is constituted of a laminated film of a silicon film, a silicon oxide film, and a silicon nitride film, the silicon film (for example, of 0.4 μm thickness) is formed on the front surface of the actuator substrate 202, the silicon oxide film (for example, of 0.4 μm thickness) is formed above the silicon film, and the silicon nitride film (for example, of 0.4 μm thickness) is formed above the silicon oxide film.

A base oxide film, for example, of $Al_2O_3$, MgO, or $ZrO_2$, etc., may be formed on the front surface of the movable film formation layer 210. Such base oxide films prevent metal atoms from escaping from the piezoelectric film 212 to be formed later. When metal electrons escape, the piezoelectric film 212 may degrade in piezoelectric characteristics. Also, when metal atoms that have escaped become mixed in the silicon layer constituting each movable film 210A, the movable film 210A may degrade in durability.

Figure 15B:
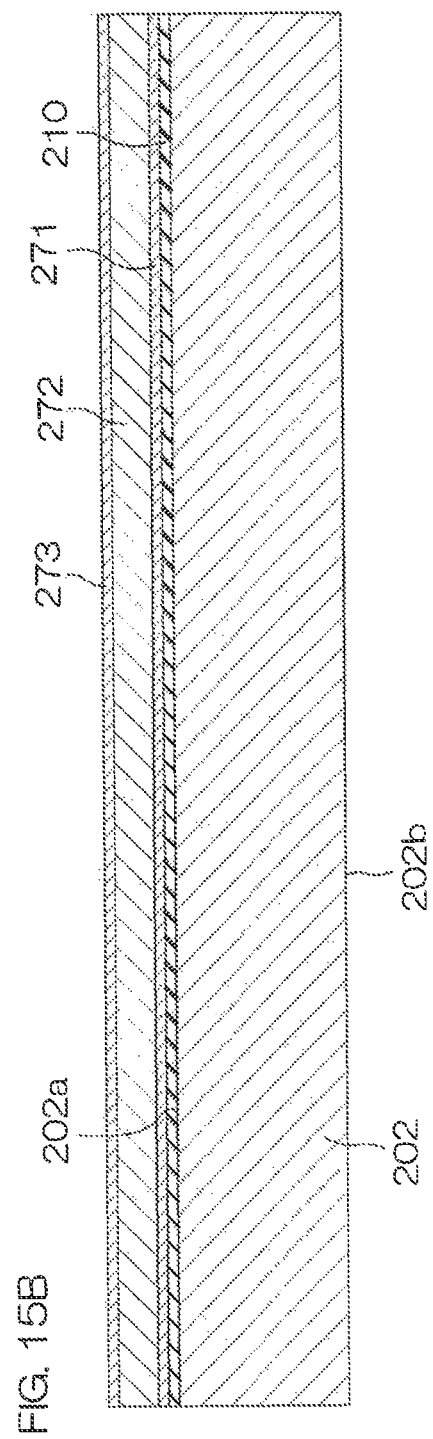
FIG. 15B is a sectional view of a step subsequent to that of FIG. 15A.

Next, a lower electrode film 271, which is a material layer of the lower electrode 211, is formed above the movable film formation layer 210 (above the base oxide film in the case where the base oxide film is formed) as shown in FIG. 15B. The lower electrode film 271 is constituted, for example, of a Pt/Ti laminated film having a Ti film (for example, of 10 nm to 40 nm thickness) as a lower layer and a Pt film (for example, of 10 nm to 400 nm thickness) as an upper layer. Such a lower electrode film 271 may be formed by the sputtering method.

Next, a material film (piezoelectric material film) 272 of the piezoelectric films 212 is formed on an entire surface above the lower electrode film 271. Specifically, for example, the piezoelectric material film 272 of 1 μm to 3 μm thickness is formed by a sol-gel method. Such a piezoelectric material film 272 is constituted of a sintered body of metal oxide crystal grains.

Next, an upper electrode film 273, which is a material of the upper electrodes 213, is formed on the entire surface of the piezoelectric material film 272. The upper electrode film 273 may, for example, be a single film of platinum (Pt). The upper electrode film 273 may, for example, be an $IrO_2/Ir$ laminated film having an $IrO_2$ film (for example, of 40 nm to 160 nm thickness) as a lower layer and an Ir film (for example, of 40 nm to 160 nm thickness) as an upper layer. Such an upper electrode film 273 may be formed by the sputtering method.

Figure 15D:
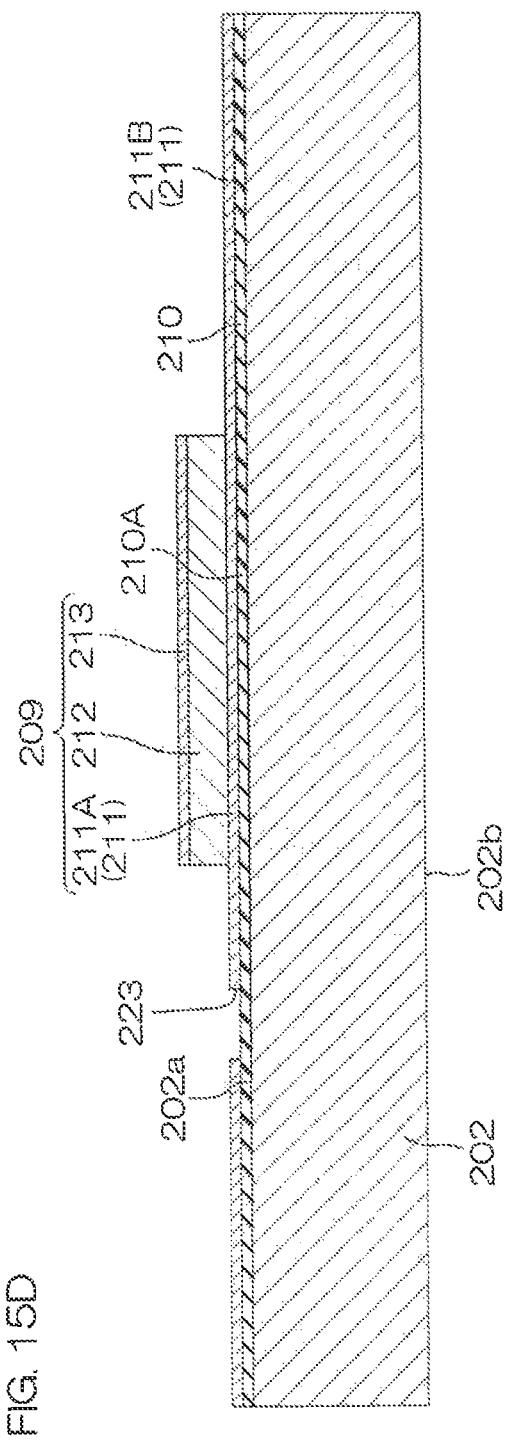
FIG. 15D is a sectional view of a step subsequent to that of FIG. 15C.

Next, as shown in FIG. 15C and FIG. 15D, patterning of the upper electrode film 273, the piezoelectric material film 272, and the lower electrode film 271 is performed. First, a resist mask with a pattern of the upper electrodes 213 is formed by photolithography. Then, as shown in FIG. 15C, the upper electrode film 273 and the piezoelectric material film 272 are etched successively using the resist mask as a mask to form the upper electrodes 213 and the piezoelectric films 212 of the predetermined patterns.

Next, after peeling off the resist mask, a resist mask with a pattern of the lower electrode 211 is formed by photolithography. Then, as shown in FIG. 15D, the lower electrode film 271 is etched using the resist mask as a mask to form the lower electrode 211 of the predetermined pattern. The lower electrode 211, constituted of the main electrode portions 211A and the extension portion 211B having the penetrating holes 223, is thereby formed. The piezoelectric elements 209, each constituted of a main electrode portion 211A of the lower electrode 211, a piezoelectric film 212, and an upper electrode 213, are thereby formed.

Next, after peeling off the resist mask, the hydrogen barrier film 214 covering the entire surface is formed as shown in FIG. 15E. The hydrogen barrier film 214 may be an $Al_2O_3$ film formed by the sputtering method and may have a film thickness of 50 nm to 100 nm. Thereafter, the insulating film 215 is formed above the entire surface of the hydrogen barrier film 214. The insulating film 215 may be an $SiO_2$ film and may have a film thickness of 200 nm to 300 nm. Next, the contact holes 233 and 234 are formed by successively etching the insulating film 215 and the hydrogen barrier film 214.

Next, as shown in FIG. 15F, a wiring film that constitutes the upper wirings 217, the lower wiring 218, and the dummy wirings 219 (219A and 219B) is formed by the sputtering method above the insulating film 215 as well as inside the contact holes 233 and 234. Thereafter, the wiring film is patterned by photolithography and etching to form the upper wirings 217, the lower wiring 218, and the dummy wirings 219 (219A and 219B) at the same time.

Figure 15G:
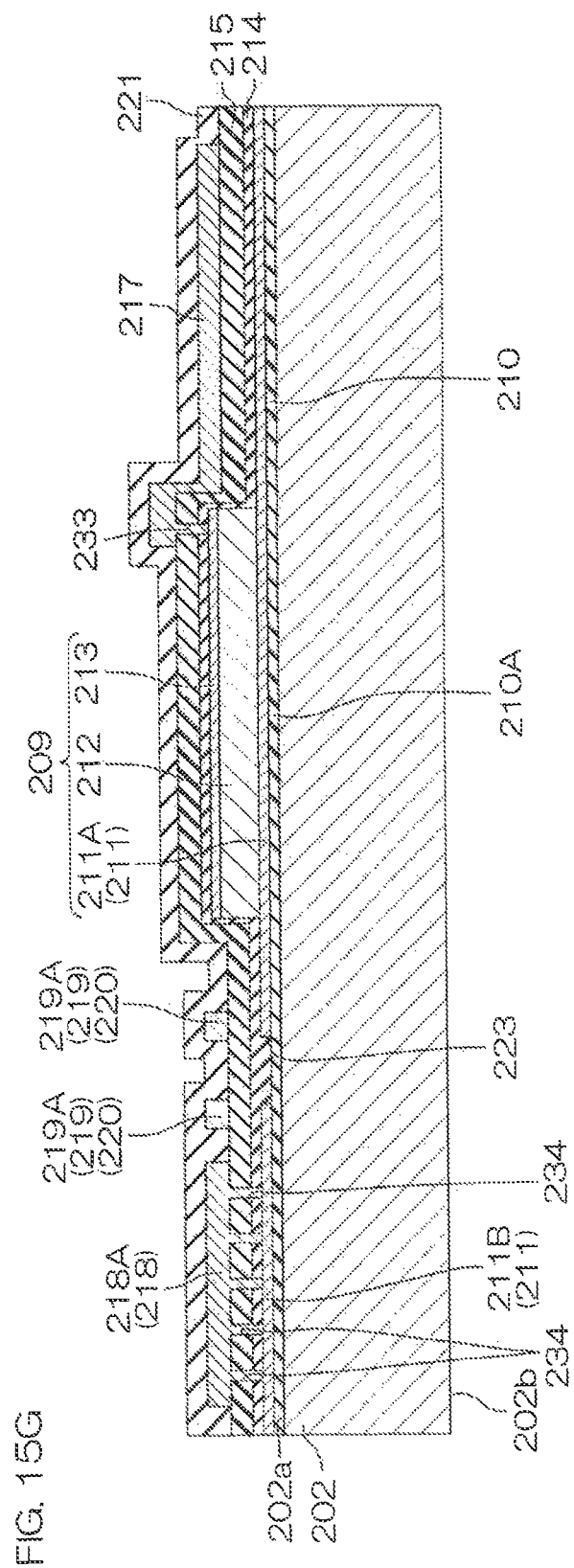
FIG. 15G is a sectional view of a step subsequent to that of FIG. 15F.

Next, as shown in FIG. 15G, the passivation film 221 that covers the wirings 217, 218, and 219 is formed on the front surface of the insulating film 215. The passivation film 221 is constituted, for example, of SiN. The passivation film 221 is formed, for example, by plasma CVD.

Figure 15H:
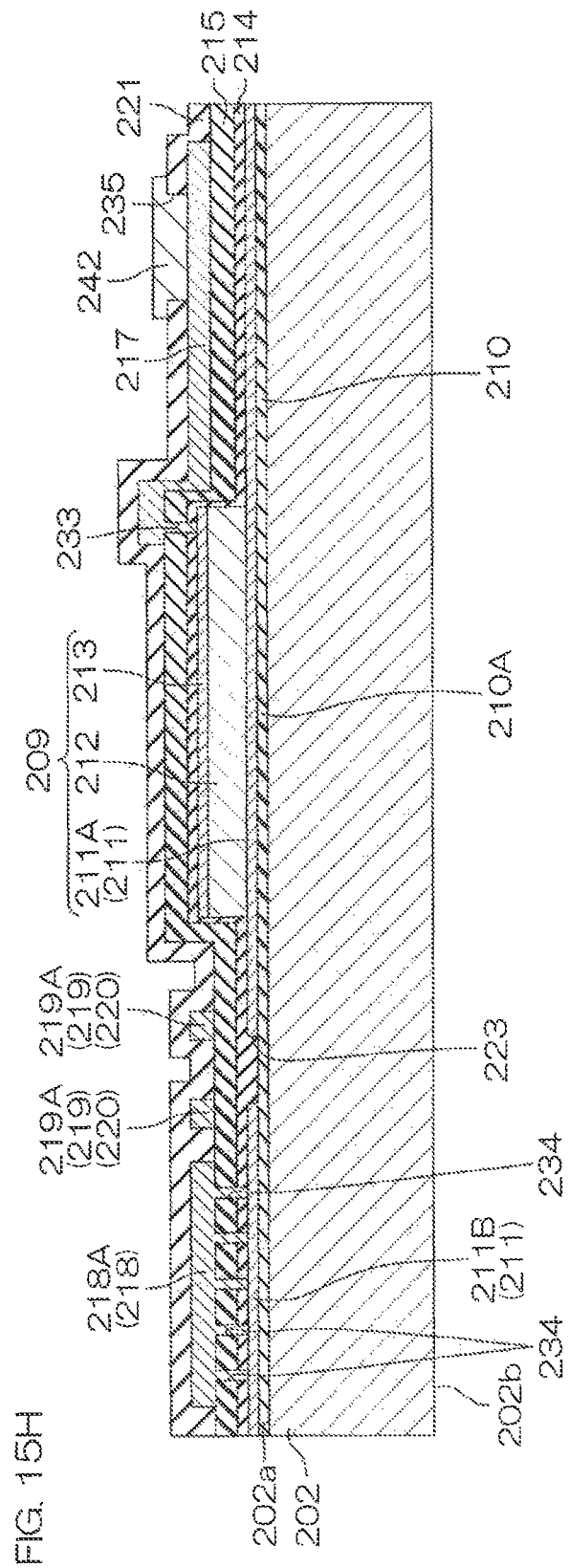
FIG. 15H is a sectional view of a step subsequent to that of FIG. 15G.

Next, a resist mask, having openings corresponding to the pad openings 235 and 236, is formed by photolithography, and the passivation film 221 is etched using the resist mask as a mask. The pad openings 235 and 236 are thereby formed in the passivation film 221 as shown in FIG. 15H. After the resist mask is peeled off, the pads 242 and 243, respectively connected to the upper wirings 217 and the lower wiring 218 via the pad openings 235 and the pad opening 236, are formed above the passivation film 221.

Figure 15I:
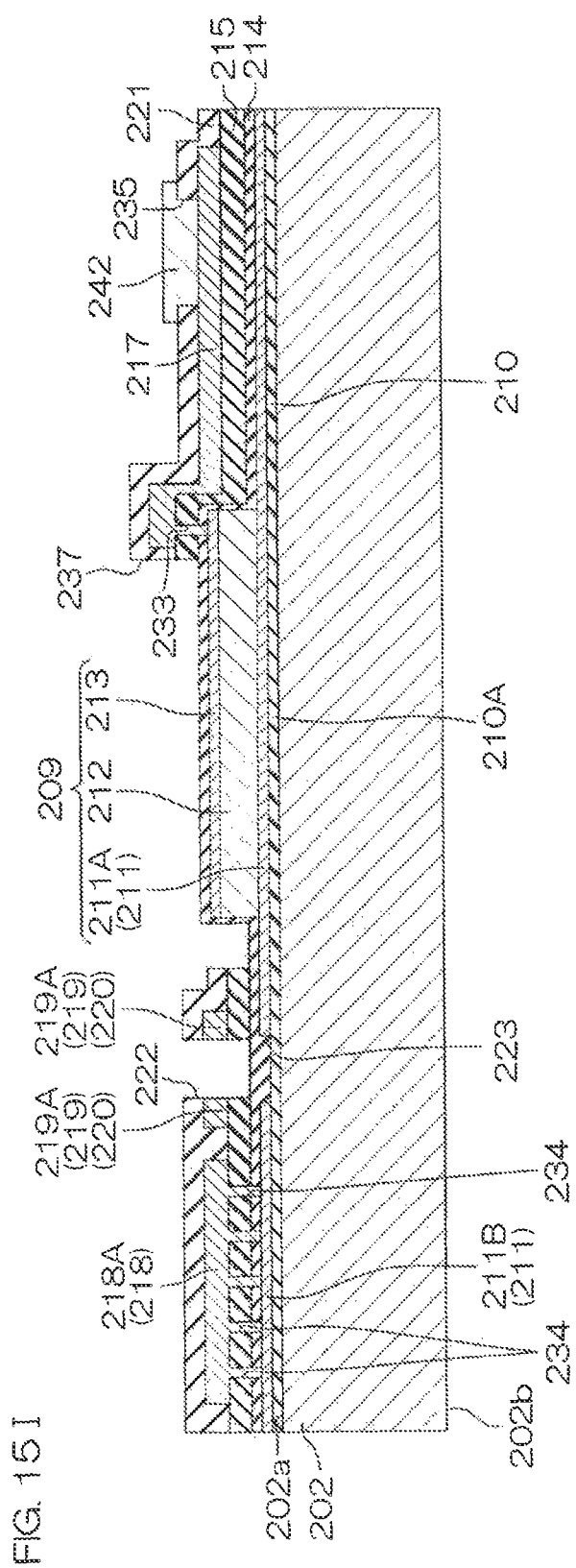
FIG. 15I is a sectional view of a step subsequent to that of FIG. 15H.

A resist mask having openings corresponding to the openings 237 and the ink supply penetrating holes 222 is then formed by photolithography, and using the resist mask as a mask, the passivation film 221 and the insulating film 215 are etched successively. The openings 237 and the ink supply penetrating holes 222 are thereby formed in the passivation film 221 and the insulating film 215 as shown in FIG. 15I.

Next, the resist mask is peeled off. A resist mask having openings corresponding to the ink supply penetrating holes 222 is then formed by photolithography, and the hydrogen barrier film 214 and the movable film formation layer 210 are etched using the resist mask as a mask. The ink supply penetrating holes 222 are thereby formed in the hydrogen barrier film 214 and the movable film formation layer 210 as shown in FIG. 15J.

Figure 15K:
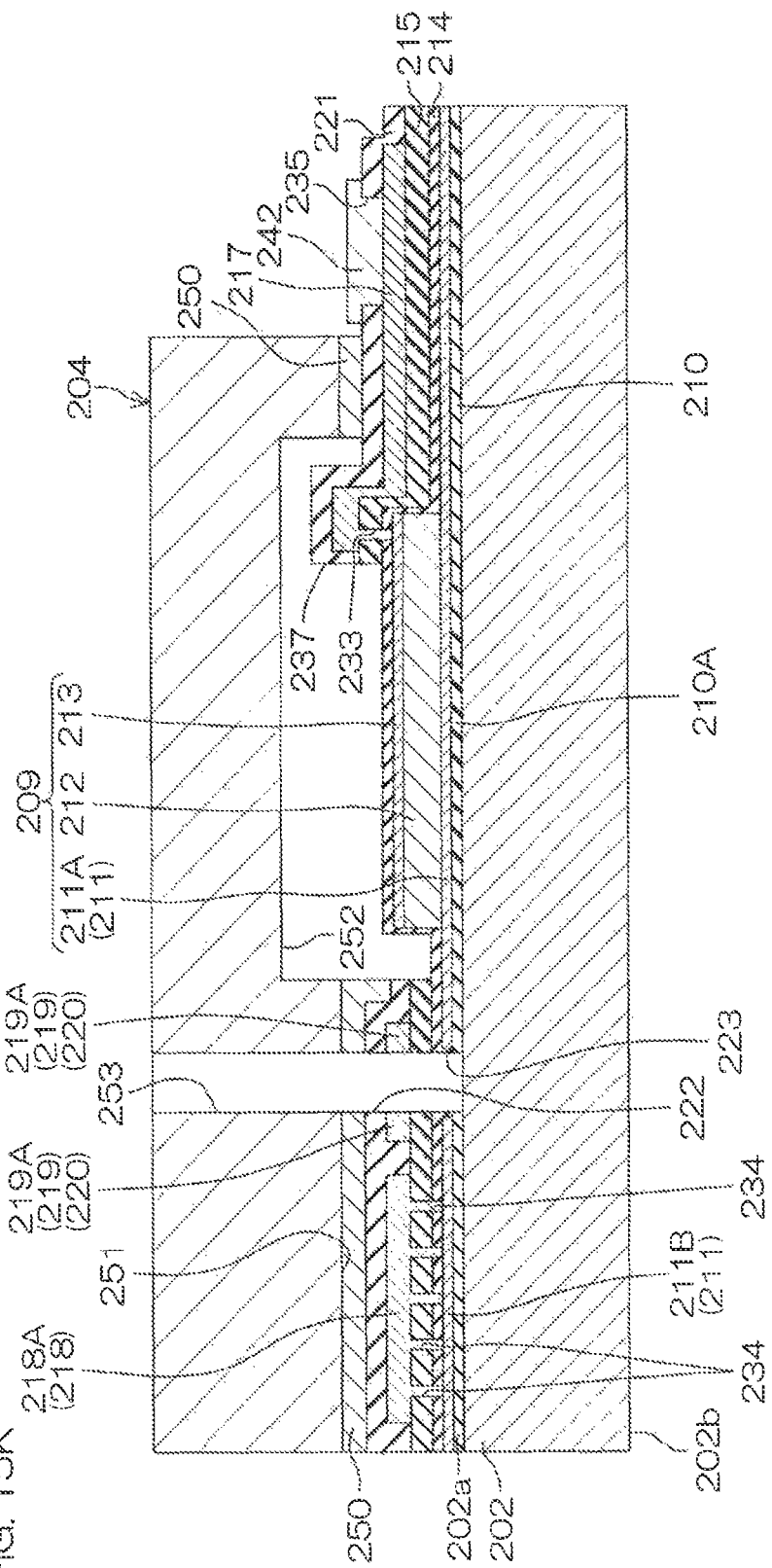
FIG. 15K is a sectional view of a step subsequent to that of FIG. 15J.

Next, as shown in FIG. 15K, the adhesive 250 is coated onto the facing surface 251 of the protective substrate 204 and the protective substrate 204 is fixed onto the actuator substrate 202 so that the ink supply passages 253 and the ink supply penetrating holes 222 are matched. In this process, the facing surface 251 of the protective substrate 204 is pressed via the passivation film 221 against the first dummy wirings 219A and the second dummy wirings 219B that are the bases with flat upper surfaces. The facing surface 251 of the protective substrate 204 is thus bonded firmly via the passivation film 221 and the adhesive 250 to the upper surfaces of the first dummy wirings 219A and the second dummy wirings 219B.

Figure 15L:
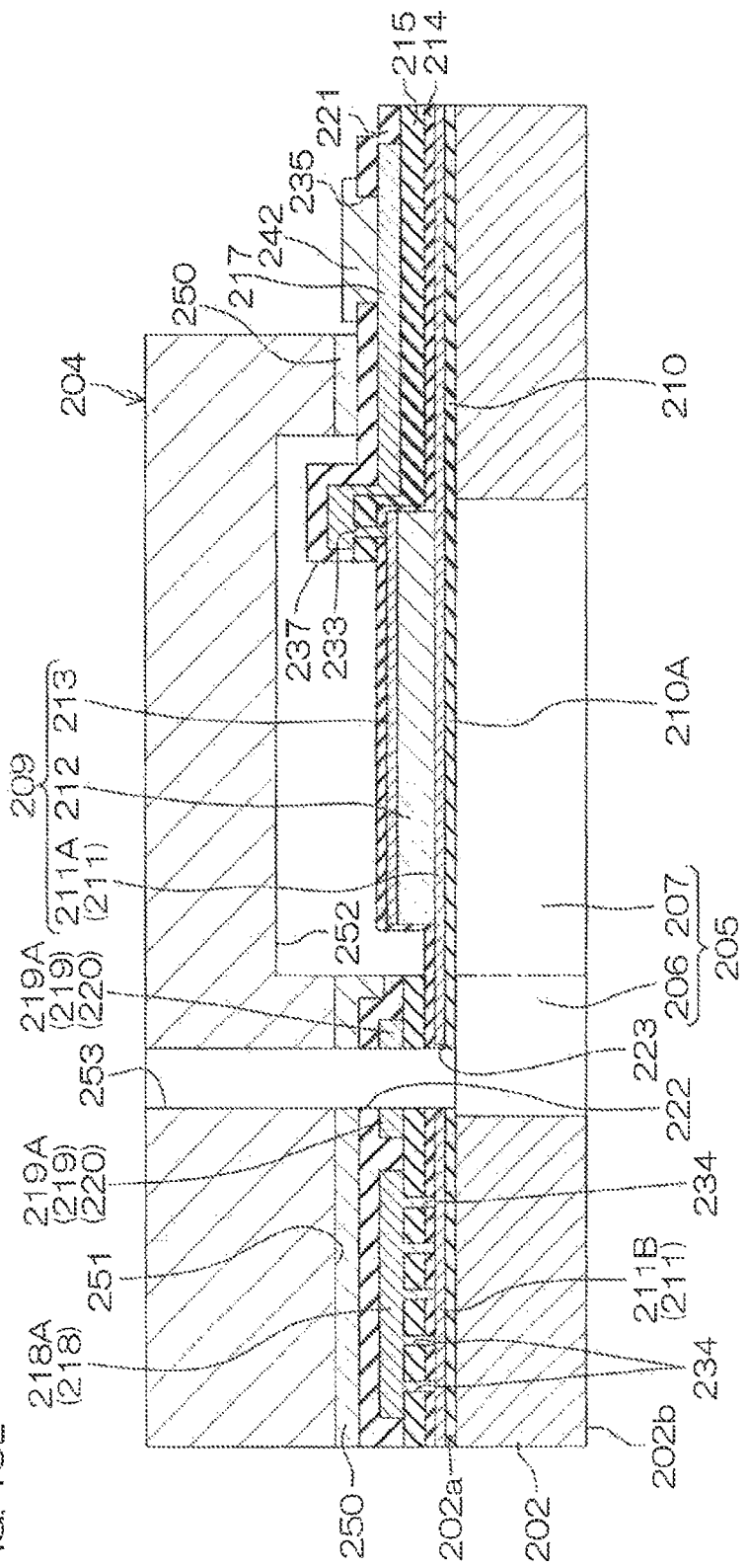
FIG. 15L is a sectional view of a step subsequent to that of FIG. 15K.

Next, as shown in FIG. 15L, rear surface grinding for thinning the actuator substrate 202 is performed. The actuator substrate 202 is made thin by the actuator substrate 202 being ground from the rear surface 202b. For example, the actuator substrate 202 with a thickness of approximately 670 μm in the initial state may be thinned to a thickness of approximately 300 μm. Next, etching (dry etching or wet etching) from the rear surface of the actuator substrate 202 is performed on the actuator substrate 202 to form the ink flow passages 205 (the ink inflow portions 206 and the pressure chambers 207).

In the etching process, the base oxide film formed on the front surface of the movable film formation layer 210 prevents the escaping of metal elements (Pb, Zr, and Ti in the case of PZT) from the piezoelectric film 212 and keeps the piezoelectric characteristics of the piezoelectric film 212 in a satisfactory state. Also as mentioned above, the base oxide film formed on the front surface of the movable film formation layer 210 contributes to maintaining the durability of the silicon layer that forms each movable film 210A.

Thereafter, as shown in FIG. 15M, the nozzle substrate 203 is adhered onto the rear surface of the actuator substrate 202 and the inkjet printing head 201 is thereby obtained.

Figure 16A:
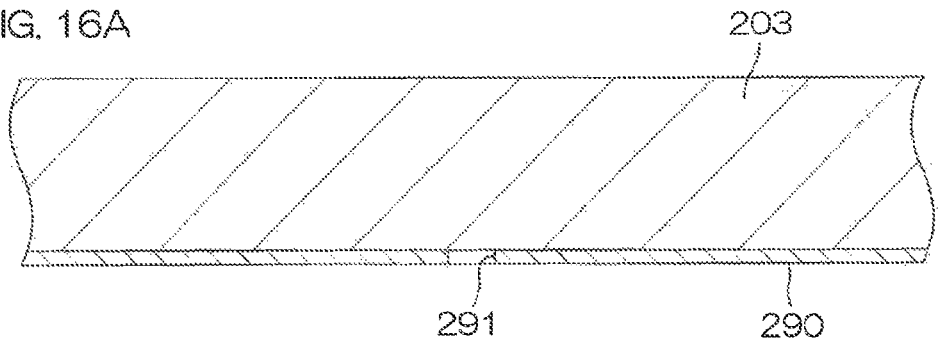
FIG. 16A is a partially enlarged sectional view of a step of forming an ink discharge hole in a nozzle substrate.
Figure 16B:
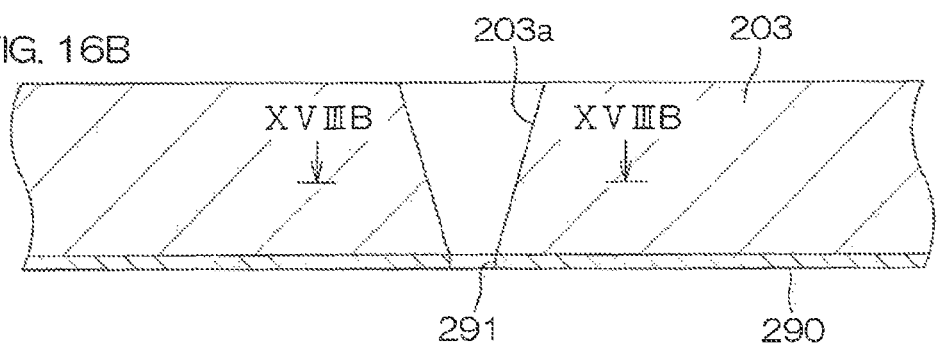
FIG. 16B is a partially enlarged sectional view of a step subsequent to that of FIG. 16A.

FIG. 16A and FIG. 16B are partially enlarged sectional views of steps of forming an ink discharge hole 203a in the nozzle substrate 203 and show a section corresponding to FIG. 9. In the present preferred embodiment, each ink discharge hole 203a is formed so that a transverse sectional shape of a processing ending end side (actuator substrate 202 side) of the ink discharge hole 203a will be a quadrilateral shape. In other words, a target shape of a transverse section of the processing ending end side of the ink discharge hole 203a is a regular quadrilateral.

Figure 17:
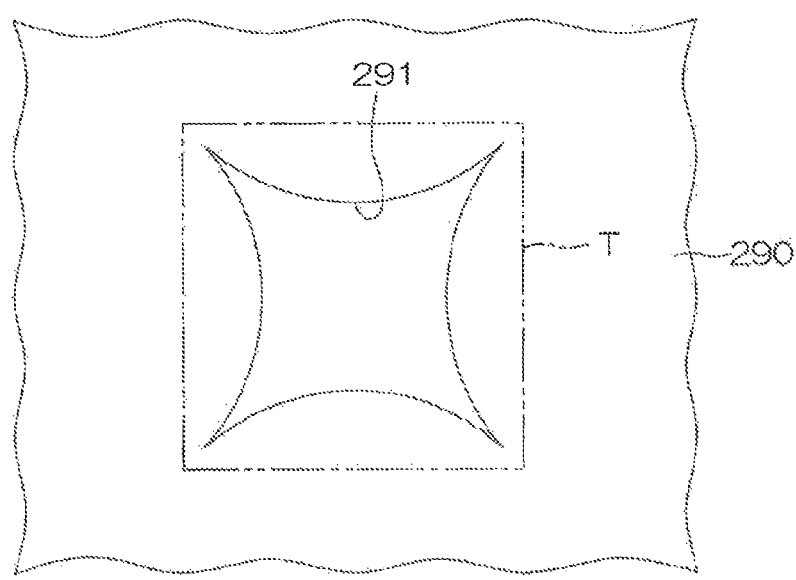
FIG. 17 is an enlarged bottom view of a portion of a resist mask used in the step of FIG. 16A.

First, a resist mask 290, having penetrating holes 291, is formed by photolithography on surface (rear surface) of the nozzle substrate 203 at an opposite side from the surface bonded to the rear surface of the actuator substrate 202. FIG. 17 is an enlarged bottom view of a portion of the resist mask 290. A bottom surface shape (transverse sectional shape) of each penetrating hole 291 is formed to a shape with which its respective sides are curved to inwardly convex arcuate shapes with respect to the target shape (the regular quadrilateral indicated by alternate long and two short dashes lines T in FIG. 17) of the transverse section at the processing ending end side of the corresponding ink discharge hole 203a.

Next, in the state where the resist mask 290 is formed on the rear surface of the nozzle substrate 203, dry etching is applied to the nozzle substrate 203. The ink discharge holes 203a are thereby formed in the nozzle substrate 203 as shown in FIG. 16B.

Figure 18A:
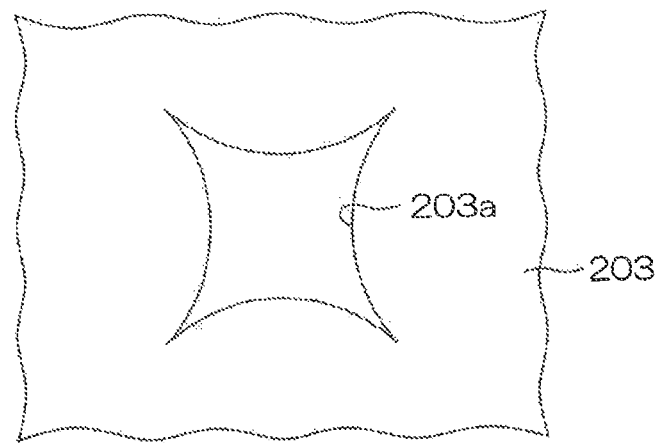
FIG. 18A is an enlarged bottom view of a bottom surface shape at a processing starting end side of an ink discharge hole.
Figure 18B:
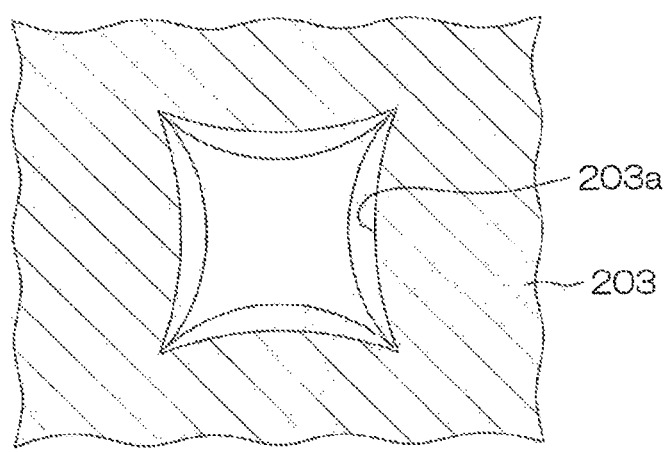
FIG. 18B is an enlarged sectional view taken along XVIIIB-XVIIIB in FIG. 16B.
Figure 18C:
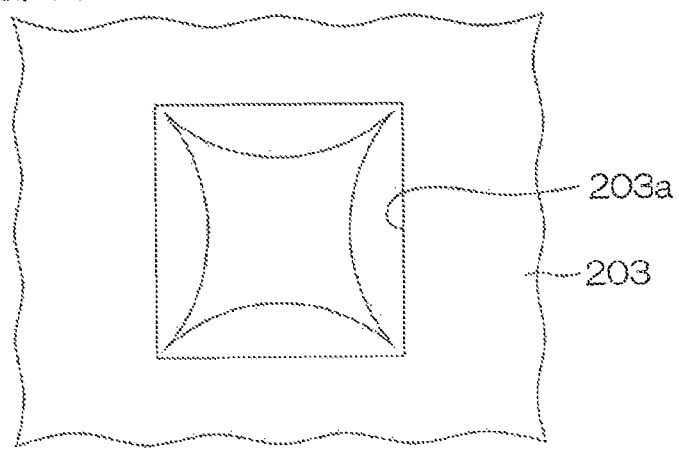
FIG. 18C is an enlarged plan view of a planar shape at a processing ending end side of the ink discharge hole.
Figure 19A:
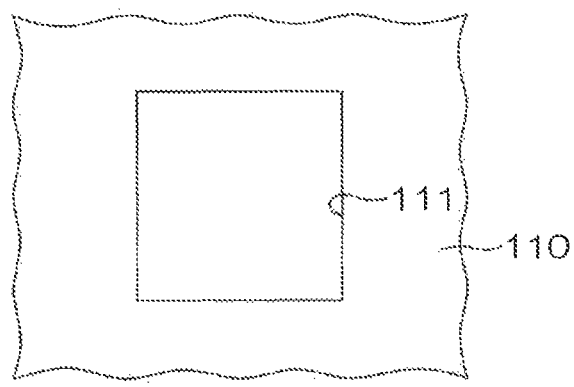
FIG. 19A, FIG. 19B, and FIG. 19C show a conventional method for forming a hole, with which a transverse sectional shape is, for example, a regular quadrilateral shape, in a substrate, with FIG. 19A being a plan view, FIG. 19B being a vertical sectional view, and FIG. 19C being a bottom view.
Figure 19B:
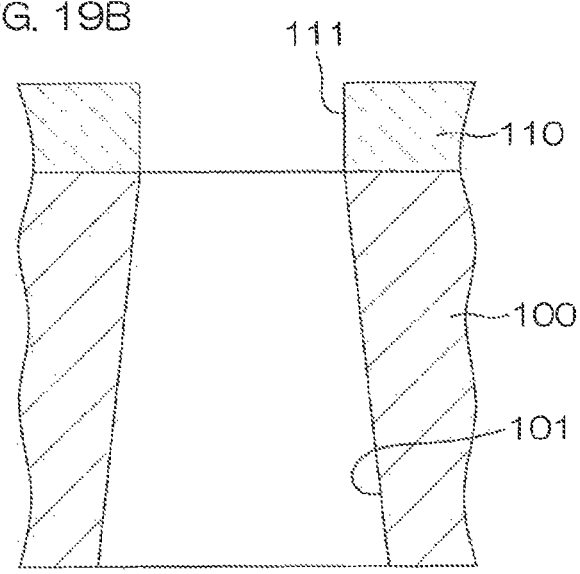
Figure 19C:
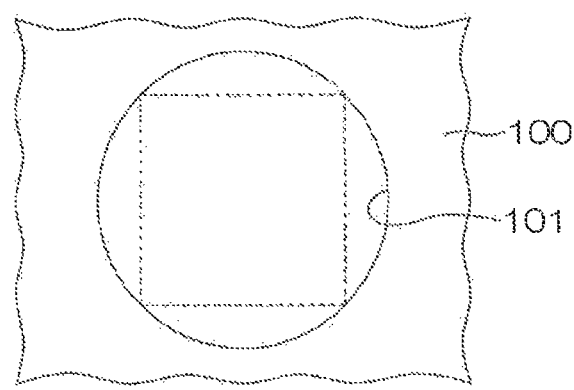

FIG. 18A is an enlarged bottom view of a bottom surface shape at a processing starting end side (the nozzle substrate 203 rear surface side) of an ink discharge hole 203. FIG. 18B is an enlarged sectional view taken along XVIIIB-XVIIIB in FIG. 16B. That is, FIG. 18B is an enlarged sectional view of a transverse sectional shape at a center-of-length portion (center-of-depth portion) of the ink discharge hole 203a. FIG. 18C is an enlarged plan view of a planar shape at a processing ending end side (the nozzle substrate 203 front surface side) of the ink discharge hole 203a.

As shown in FIG. 17, the transverse sectional shape of each penetrating hole 291 formed in the resist mask 290 is formed to the shape with which its respective sides are curved to inwardly convex arcuate shapes with respect to the target shape T of the transverse section at the processing ending end side of the corresponding ink discharge hole 203a. Therefore, as shown in FIG. 18A, the bottom surface shape at the processing starting end side (the nozzle substrate 203 rear surface side) of the ink discharge hole 203a is substantially the same shape as the transverse sectional shape of the penetrating hole 291. As the etching progresses, inward projection amounts of the respective arcuate shaped sides of the transverse sectional shape of the ink discharge hole 203a decrease as shown, for example, in FIG. 18B. That is, as the etching progresses, the transverse sectional shape of the ink discharge hole 203a approaches the regular quadrilateral that is the target shape T. At the processing ending end side (the nozzle substrate 203 front surface side) of the ink discharge hole 203a, the planar shape is substantially the same shape as the regular quadrilateral that is the target shape T as shown in FIG. 18C.

In other words, in comparison to the transverse sectional shape at the processing starting end side (the nozzle substrate 203 rear surface side) of the ink discharge hole 203a, the transverse sectional shape at the processing ending end side of the ink discharge hole 203a is a shape that is closer to the regular quadrilateral that is the target shape T. In the present preferred embodiment, the inward projection amounts of the respective arcuate shaped sides of the transverse sectional shape of the penetrating hole 291 are determined so that the transverse sectional shape at the processing ending end side (nozzle substrate 203 front surface side) of the ink discharge hole 203a will be a shape that is substantially the same as the regular quadrilateral that is the target shape T.

Thereafter, the resist mask 290 is peeled off. The nozzle substrate 203 having the ink discharge holes 203a such as shown in FIG. 9 is thereby obtained.

Although with the second preferred embodiment described above, the target shape of the transverse section at the processing ending end side of each ink discharge hole 203a is a regular quadrilateral, the target shape may be a polygon other than a regular quadrilateral, such as a triangle, a quadrilateral other than a regular quadrilateral, a pentagon, or a hexagonal shape.

Although with the first and second preferred embodiments described above, cases where the present invention is applied to an infrared sensor and an inkjet printing head were described, the present invention may also be applied to a device other than an infrared sensor or an inkjet printing head as long as it is a device that includes a substrate having a hole with a transverse section having a polygonal shape.

The present application corresponds to Japanese Patent Application No. 2016-1219 filed on Jan. 6, 2016 in the Japan Patent Office, and the entire disclosure of this application is incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A substrate having a hole, the substrate having the hole being such that
    a transverse sectional shape of a processing starting end side of the hole is a shape with which respective sides of a predetermined polygon are formed to inwardly convex arcuate shapes and
    a transverse sectional shape of a processing ending end side of the hole is a shape closer to the predetermined polygon in comparison to the transverse sectional shape of the processing starting end side of the hole.

2. The substrate having the hole according to claim 1, wherein the predetermined polygon is a quadrilateral.

3. The substrate having the hole according to claim 1, wherein the predetermined polygon is a triangle.

4. An infrared sensor comprising:
    the substrate having the hole according to claim 1;
    a heat insulating film held by the substrate so as to face the hole; and
    a pyroelectric element formed above the heat insulating film.

5. The infrared sensor according to claim 4, wherein the pyroelectric element includes a lower electrode formed at a surface of the heat insulating film at an opposite side from the hole, an upper electrode disposed at an opposite side from the heat insulating film with respect to the lower electrode, and a pyroelectric film provided between the lower electrode and the upper electrode.

6. A method for manufacturing a substrate having a hole, the method for manufacturing the substrate having the hole comprising:
    a step of disposing, on one surface side of the substrate, a mask having a penetrating hole with a shape with respective sides thereof being curved to inwardly convex arcuate shapes with respect to a predetermined polygon; and
    a step of applying dry etching to the substrate via the mask to form a hole in the substrate.

7. The method for manufacturing the substrate having the hole according to claim 6, wherein the predetermined polygon is a quadrilateral.

8. The method for manufacturing the substrate having the hole according to claim 6, wherein the predetermined polygon is a triangle.

9. A method for manufacturing an infrared sensor, the method for manufacturing the infrared sensor comprising:

a step of forming a heat insulating film above one surface of the substrate;

a step of forming a pyroelectric element above the heat insulating film;

a step of forming a covering film covering surfaces of the heat insulating film and the pyroelectric element;

a step of forming, above the pyroelectric element, a contact hole, exposing a portion of the upper electrode, in the covering film;

a step of forming, above the covering film, a wiring with one end portion contacting the upper electrode via the contact hole and another end portion being led to an outer side of the pyroelectric element; and a step of forming a cavity, penetrating through the substrate in a thickness direction, at a position of the substrate facing the pyroelectric element; and wherein the step of forming the cavity includes a step of disposing, on a surface of the substrate at an opposite side from the surface at which the heat insulating film has been formed, a mask having a penetrating hole with a shape with respective sides thereof being curved to inwardly convex arcuate shapes with respect to a predetermined polygon and a step of applying dry etching to the substrate via the mask to form the cavity in the substrate.

* * * * *